United States Patent [19]
Frisina et al.

[11] Patent Number: 5,985,721
[45] Date of Patent: *Nov. 16, 1999

[54] SINGLE FEATURE SIZE MOS TECHNOLOGY POWER DEVICE

[75] Inventors: Ferruccio Frisina, Sant'Agata Li Battiati; Angelo Magri, Belpasso; Giuseppe Ferla, Catania, all of Italy; Richard A. Blanchard, Los Altos, Calif.

[73] Assignees: SGS-Thomson Microelectronics, S.r.l., Agrate Brianza; Consorzio Per La Ricerca Sulla Microelettronica Nel Mezzogiorno, Catania, both of Italy

[ * ] Notice: This patent is subject to a terminal disclaimer.

[21] Appl. No.: 08/933,505

[22] Filed: Sep. 18, 1997

Related U.S. Application Data

[62] Division of application No. 08/739,465, Oct. 29, 1996.

[30] Foreign Application Priority Data

Oct. 30, 1995 [EP] European Pat. Off. .............. 95830454

[51] Int. Cl.$^6$ .................................................. H01L 21/336
[52] U.S. Cl. ............................................ 438/268; 438/302
[58] Field of Search .................................... 438/268, 138, 438/302, 525

[56] References Cited

U.S. PATENT DOCUMENTS

| | | | |
|---|---|---|---|
| 4,015,278 | 3/1977 | Fukuta | ........................................ 357/22 |
| 4,055,884 | 11/1977 | Jambotkar | ................................. 29/571 |

(List continued on next page.)

FOREIGN PATENT DOCUMENTS

| | | | |
|---|---|---|---|
| 1 123 119 | 5/1982 | Canada | ........................... H01L 29/04 |
| 1 136 291 | 11/1982 | Canada | ........................... H01L 29/94 |

(List continued on next page.)

OTHER PUBLICATIONS

Wolf, Stanley "Silicon Processing For The VLSI Era vol. 2: Process Integration", Lattice Press, pp. 143–152, month unknown 1990.

European Search Report from European Patent Application No. 95830454.5, filed Oct. 30, 1995.

(List continued on next page.)

*Primary Examiner*—John F. Niebling
*Assistant Examiner*—Michael S. Lebentritt
*Attorney, Agent, or Firm*—Wolf, Greenfield & Sacks, P.C.

[57] ABSTRACT

A MOS technology power device comprises a semiconductor material layer of a first conductivity type, a conductive insulated gate layer covering the semiconductor material layer, and a plurality of elementary functional units. The conductive insulated gate layer includes a first insulating material layer placed above the semiconductor material layer, a conductive material layer placed above the first insulating material layer, and a second insulating material layer placed above the conductive material layer. Each elementary functional unit includes an elongated body region of a second conductivity type formed in the semiconductor material layer. Each elementary functional unit further includes an elongated window in the insulated gate layer extending above the elongated body region. Each elongated body region includes a source region doped with dopants of the first conductivity type, intercalated with a portion of the elongated body region wherein no dopant of the first conductivity type are provided. The MOS technology power device further includes a plurality of insulating material sidewall spacers disposed above the semiconductor material layer along elongated edges of each elongated window to seal the edges of each elongated window in the insulated gate layer from a source metal layer disposed over the insulated gate layer and the semiconductor material layer. The source metal layer contacts each body region and each source region through each elongated window along the length of the elongated body region.

39 Claims, 16 Drawing Sheets

U.S. PATENT DOCUMENTS

| | | |
|---|---|---|
| 4,072,975 | 2/1978 | Ishitani . |
| 4,145,700 | 3/1979 | Jambotkar .................. 357/23 |
| 4,344,081 | 8/1982 | Pao et al. ................... 357/43 |
| 4,345,265 | 8/1982 | Blanchard ................. 357/23 |
| 4,376,286 | 3/1983 | Lidow . |
| 4,399,449 | 8/1983 | Herman et al. ............ 357/53 |
| 4,412,242 | 10/1983 | Herman et al. ............ 357/52 |
| 4,414,560 | 11/1983 | Lidow ....................... 357/39 |
| 4,593,302 | 6/1986 | Lidow . |
| 4,605,948 | 8/1986 | Martinelli ................. 357/34 |
| 4,642,666 | 2/1987 | Lidow et al. ............. 357/23.4 |
| 4,680,853 | 7/1987 | Lidow . |
| 4,705,759 | 11/1987 | Lidow et al. .............. 437/29 |
| 4,716,126 | 12/1987 | Cogan ........................ 437/24 |
| 4,798,810 | 1/1989 | Blanchard et al. ........ 437/29 |
| 4,816,882 | 3/1989 | Blanchard et al. ........ 357/23.4 |
| 4,901,127 | 2/1990 | Chow et al. ............... 357/23.4 |
| 4,927,772 | 5/1990 | Arthur et al. .............. 437/6 |
| 4,931,408 | 6/1990 | Hshieh ...................... 437/44 |
| 4,963,972 | 10/1990 | Shinohe et al. ............ 357/38 |
| 4,974,059 | 11/1990 | Kinzer ....................... 357/23.4 |
| 5,008,725 | 4/1991 | Lidow . |
| 5,015,593 | 5/1991 | Yawata et al. ............. 437/25 |
| 5,031,009 | 7/1991 | Fujihira ..................... 357/23.4 |
| 5,043,781 | 8/1991 | Nishiura et al. ........... 357/23.6 |
| 5,119,153 | 6/1992 | Korman et al. ............ 357/23.4 |
| 5,130,767 | 7/1992 | Lidow et al. ............... 357/23.4 |
| 5,160,985 | 11/1992 | Akiyama .................... 257/145 |
| 5,164,804 | 11/1992 | Terashima .................. 257/487 |
| 5,191,396 | 3/1993 | Lidow et al. ............... 257/339 |
| 5,208,471 | 5/1993 | Mori et al. ................. 257/327 |
| 5,286,984 | 2/1994 | Nakagawa et al. ........ 257/139 |
| 5,338,961 | 8/1994 | Lidow et al. ............... 257/342 |
| 5,382,538 | 1/1995 | Zambrano . |
| 5,397,728 | 3/1995 | Sasaki et al. ............... 437/44 |
| 5,418,179 | 5/1995 | Hotta ......................... 437/57 |
| 5,426,320 | 6/1995 | Zambrano ................. 257/328 |
| 5,442,216 | 8/1995 | Gough ....................... 257/355 |
| 5,489,799 | 2/1996 | Zambrano . |
| 5,508,217 | 4/1996 | Sawada ...................... 437/40 |
| 5,563,436 | 10/1996 | Barret et al. ............... 257/328 |
| 5,621,234 | 4/1997 | Kato .......................... 257/339 |
| 5,631,483 | 5/1997 | Ferla et al. ................. 257/341 |
| 5,670,392 | 9/1997 | Ferla et al. ................. 437/29 |
| 5,731,604 | 3/1998 | Kinzer ....................... 257/153 |
| B1 4,959,699 | 10/1993 | Lidow et al. .............. 257/328 |

FOREIGN PATENT DOCUMENTS

| | | | |
|---|---|---|---|
| 0 119 400 | 9/1984 | European Pat. Off. ........ H01L 29/78 |
| 0 211 972 | 3/1987 | European Pat. Off. ........ H01L 29/78 |
| 0 237 932 | 9/1987 | European Pat. Off. ........ H01L 29/60 |
| 0 252 236 | 1/1988 | European Pat. Off. ........ H01L 29/78 |
| 0 279 403 | 8/1988 | European Pat. Off. ........ H01L 29/78 |
| 0 304 839 | 3/1989 | European Pat. Off. ........ H01L 21/28 |
| 0 358 389 | 3/1990 | European Pat. Off. ........ H01L 29/06 |
| 0 393 949 | 10/1990 | European Pat. Off. ........ H01L 29/78 |
| 0 405 138 | 1/1991 | European Pat. Off. ........ H01L 29/72 |
| 0 543 313 | 5/1993 | European Pat. Off. ........ H01L 29/78 |
| 0 632 503 | 1/1995 | European Pat. Off. ........ H01L 29/06 |
| 0 671 769 | 9/1995 | European Pat. Off. ........ H01L 29/78 |
| 0 685 886 | 12/1995 | European Pat. Off. ........ H01L 23/48 |
| 2 640 081 | 6/1990 | France ............ H01L 27/10 |
| 51-48981 | 4/1976 | Japan ............ H01L 29/78 |
| 51-85381 | 7/1976 | Japan ............ H01L 29/78 |
| 51-23088 | 9/1977 | Japan ............ H01L 29/78 |
| 52-65943 | 9/1977 | Japan ............ H01L 29/78 |
| 53-66181 | 6/1978 | Japan ............ H01L 29/78 |
| 53-74385 | 7/1978 | Japan ............ H01L 29/76 |
| 53-135284 | 11/1978 | Japan ............ H01L 29/78 |
| 2 087 648 | 5/1982 | United Kingdom ........ H01L 23/00 |

WO-A-94
11904 5/1994 WIPO ................. H01L 29/78

OTHER PUBLICATIONS

Patent Abstracts of Japan, vol. 05, No. 442 (E–1131), Nov. 11, 1991 & JP–A–03 185737 (Toshiba Corp.).

Patent Abstracts of Japan, vol. 011, No. 231 (E–527), Jul. 28, 1987 & JP–A–62 047162 (Matsushita Electric Works Ltd.).

Patent Abstracts of Japan, vol. 014, No. 038 (E–878), Jan. 24, 1990 & JP–A–01 272163 (Fuji Electric Co. Ltd.).

Patent Abstracts of Japan, vol. 017, No. 039 (E–1311), Jan. 25, 1993 & JP–A–04 256367 (Hitachi Ltd.).

Patent Abstracts of Japan, vol. 017, No. 213 (E–1356), Apr. 26, 1993 & JP–A–04 349660 (Toshiba Corp.).

European Search Report from European Patent Application No. 95830468.5 filed Nov. 6, 1995.

European Search Report from European Patent Application 95830055.0, filed Feb. 24, 1995.

European Search Report from European Patent Application 95830535.1, filed Dec. 22, 1995.

European Search Report from European Patent Application No. 95830453.7, filed Oct. 30, 1995.

European Search Report from European Patent Application 95830542.7, filed Dec. 28, 1995.

Mena J., et al., "High Frequency Performance of VDMOS Power Transistors", International Electron Devices Meeting. Technical Digest, Washington, D.C., USA, Dec. 8–10, 1980, 1980 New York, NY, USA.

Patent Abstracts of Japan, vol. 005, No. 040 (E–049), Mar. 17, 1981 & JP–A–55 163877 (Toshiba Corp.).

Patent Abstracts of Japan, vol. 014 No. 387 (E–0967), Aug. 21, 1990 & JP–A–02 143566 (Toshiba Corp.) Jun. 1, 1990.

Patent Abstracts of Japan, vol. 008, No. 053 (E–231), Mar. 9, 1984 & JP–A–58 206174 (Tokyo Shibaura Denki KK).

Semiconductor Science and Technology, Apr. 1993, UK, vol. 8, No. 4, oo 488–494, Galvagno G., et al. "Diffusion and Outdiffusion of Aluminum Implanted into Silicon".

Stanford Electronics Laboratories, Integrated Circuits Laboratory, Stanford University, Stanford, CA, Technical Report No. 4956–1, Mar. 1976, Michael Donald Pocha, "High Voltage Double Diffused MOS Transistors for Integrated Circuits" on pp. 229–240.

Solid State Electronics, vol. 27, No. 5, pp. 419–432, 1984, P. McGregor, et al, "Small–Signal High–Frequency Performance Of Power MOS Transistors".

Siliconix Technical Proposal in response to N.A.F.I., Solicitation #N00163–77–R–1197, Aug. 31, 1977, Labor And Materials to Design, Develop and Fabricate a 500V/2A N–Channel Metal Oxide Semiconductor F.E.T.

IEEE Transactions On Electron Devices, vol. ED–27, No. 2, Feb. 1980, S.C. Sun, et al., "Modeling Of The On–Resistance Of LDMOS, VDMOS, and VMOS Power Transistors", pp. 356–367.

IEEE Transactions On Electron Devices, vol. ED–31, No. 1, Jan. 1984, pp. 109–113, Jose G. Mena, et al., "Breakdown Voltage Design Considerations in VDMOS Structures".

Solid State Electronics, vol. 29, No. 6, pp. 647–656, 1986, Jose G. Mena, et al., "High–Voltage Multiple–Resistivity Drift–Region LDMOS". Month Unknown.

Solid State Electronics, 1977, vol. 29, pp. 875–878, Surinder Krishna, "Second Breakdown In High Voltage MOS Transistors" Month Unknown.

Electronic Design, For Engineers and Engineering Managers—Worldwide, pp. 8276–8282, "HEXFET, A New Power Technology Cuts On–Resistance, Boosts Ratings" Date Unknown.

ICs and Semiconductors, pp. 8272–8275 Date Unknown.

Laid Open Patent Specification No. 85073/80, Laid Open Date: Jun. 26, 1980, Patent No. 75/162,677, Kanushiki Kaisha Hitachi Seisakusho, "Methods For Manufacturing Insulated Gate Type Field Effect Transistors".

IEEE Journal of Solid–State Circuits, vol. SC–11, No. 4, Aug. 1976, Isao Yoshida, et al., "A High Power MOSFET With A Vertical Drain Electrode And A Meshed Gate Structure", pp. 472–477.

International Electron Devices Meeting—Tech. Digest, Dec. 8–10, 1980, Washington, D.C., pp. 91–94, J. Mena, et al., "High Frequency Performance Of VDMOS Power Transistors".

SINGLE FEATURE SIZE MOS TECHNOLOGY POWER DEVICE

This application is a division of application Ser. No. 08/739,465, filed Oct. 29, 1996, entitled SINGLE FEATURE SIZE MOS TECHNOLOGY POWER DEVICE and now pending.

BACKGROUND OF THE INVENTION

1. Field of the Invention

The present invention relates to either discrete devices or integrated power semiconductor devices including MOS-gated power devices such as, for example, power MOSFETS, IGBTs, MOS-gated thyristors or other MOS-gated power devices. In particular, the invention relates to a MOS-gated power device having a smaller minimum dimension Lp that is a function of a single feature size and that yields an increased density of MOS-gated power devices per unit area.

2. Discussion of the Related Art

MOS technology power devices as known in the related art are composed of a plurality of elementary functional units integrated in a semiconductor chip. Each elementary functional unit is a vertical MOSFET, and all the elementary functional units are connected in parallel. With this arrangement, each elementary vertical MOSFET contributes a fraction of an overall current capacity of the power device.

A MOS technology power device chip typically includes a lightly doped semiconductor layer of a first conductivity type forming a common drain layer for all the elementary vertical MOSFETS. The lightly doped layer is superimposed over a heavily doped semiconductor substrate. Each elementary functional unit includes a body region of a second conductivity type formed in the common drain layer. U.S. Pat. No. 4,593,302 (Lidow et al.) discloses a so called "cellular" power device, wherein the body region of the elementary functional units has a polygonal layout, such as for example a square or hexagonal shape. For this reason, the elementary functional units are also called "elementary cells". In addition, MOS technology power devices are also known in the related art wherein the body region of each elementary functional units is an elongated stripe.

For any of the above power MOS devices, a typical vertical structure of the elementary functional units (i.e. a cross-section view) of the MOS technology power device is as shown in FIG. 1. In FIG. 1, the heavily doped semiconductor substrate is indicated by reference numeral 1 and the lightly doped semiconductor layer is indicated by reference numeral 2. The body region 3 of the elementary functional unit includes a central heavily doped portion 4, called a "deep body region", and a lateral lightly doped portion 5, having a lower dopant concentration than the heavily doped deep body region, which forms a channel region of the elementary vertical MOSFET. A doping level of the lateral portions 5 of the body region determines a threshold voltage of the power device. Inside the body region 3, a source region 6 of the same conductivity type as the common drain layer 2 is formed. A thin oxide layer 7 (a gate oxide layer) and a polysilicon layer 8 (a gate electrode of the power device) cover a surface of the semiconductor layer 2 between the body regions 3, and the layers also extend over the lightly doped lateral portion of the body regions. The polysilicon layer 8 is covered by a dielectric layer 9 in which contact windows 11 are opened over each body region to allow a superimposed metal layer 10 (a source electrode of the power device) to be deposited through the contact window and to contact the source regions 6 and the deep body region 4.

In the structure of FIG. 1, a short-circuit is defined between the source region and the deep body region to prevent a parasitic bipolar junction transistor having an emitter, a base and a collector respectively formed by the source region 6, the deep body region 4 and the heavily doped semiconductor substrate 1, from triggering on. The parasitic bipolar transistor will trigger "on" if the lateral current flow in the body below the source produces a voltage drop greater than approximately 0.7 V, forward biasing the emitter-to-base (EB) junction. The deep body region 4 increases the ruggedness of the power device because it reduces the base resistance of such a parasitic transistor.

The structure of FIG. 1 is manufactured by forming the common drain layer 2 over the heavily doped substrate 1, generally by means of an epitaxial growth. The thin oxide layer 7 is thermally grown over an active area of the common drain layer 2, wherein the elementary functional units of the MOS technology power device will be formed, and the polysilicon layer 8 is deposited on the thin oxide layer. The deep body regions 4 are formed by selective introduction of a high dose of a dopant to form the central heavily doped deep body regions 4. Windows 12 are formed in the gate oxide layer and the polysilicon layer by a selective etching of the polysilicon and gate oxide layers via a second mask to open the windows 12 where the elementary functional units will be formed. The lateral lightly doped portions of the body regions are then formed by selective introduction of a low dose of dopants into the common drain layer through the windows to form the lightly doped portions of the body regions. Next, the source regions 6 are formed as will be described in more detail below, followed by deposition of the dielectric layer 9 and selective etching thereof to open the contact windows 11. The metal layer 10 is then deposited and patterned.

This process involves the use of a minimum of four photolithographic masks: a first mask is used for the formation of the deep body regions 4; a second mask is used to selectively etch the polysilicon 8 and gate oxide 7 layers; a third mask is used to form the source regions 6 and a fourth mask is used to open the contact windows 11 in the dielectric layer 9. The mask for the introduction of the dopants forming the source regions is provided partially by the polysilicon and oxide layers, and partially by photoresist isles over a middle portion of the deep body regions 4. The photoresist isles are formed by depositing a photoresist layer over the common drain layer, selectively exposing the photoresist layer to a light source, and selectively removing the photoresist layer to provide the photoresist isles.

Referring again to FIG. 1, a dimension Lp of each window 12 in the polysilicon 8 and gate oxide 7 layers is given by equation (1):

$$Lp = a + 2t \quad (1)$$

where "a" is the width of the contact window 11 in the dielectric layer 9 and "t" is the distance between an edge of the polysilicon 8 and gate oxide 7 layers and an edge of the window 11 in the dielectric layer 9. The dimension "a" of the contact window is given by equation (2):

$$a = c + 2b \quad (2)$$

where "b" is a distance between an edge of the contact window 11 and an inner edge of the source region 6, or in other words the length of the source region available to be contacted by the metal layer 10, and "c" is the dimension of a surface of the deep body region wherein the source regions are absent or in other words the distance between the inner edges of the source regions, corresponding to the length of the surface of the deep body region available to be contacted by the metal layer. The dimension Lp is therefore given by equation (3):

$$Lp = c + 2b + 2t \quad (3)$$

Accordingly, the elementary functional units of the related art have the dimension Lp determined by "three feature sizes", in particular the dimension Lp depends on the parameters "c", "b" and "t".

In MOS technology power devices, the electrical parameters to be optimized are the output resistance in the "on" condition Ron, a gate-to-drain capacitance (feedback capacitance) and a gate-to-source capacitance (input capacitance) of the MOS technology power device for a specific die size and breakdown voltage. The output resistance Ron is the sum of several components, each of which is associated with a particular physical region of the device. More specifically, Ron is made up of the components as shown in equation (4):

$$Ron = Rc + Racc + Rjfet + Repi \quad (4)$$

where Rc is a channel resistance associated with the channel region, Racc is an accumulation region resistance associated with a surface portion of the common drain layer between the body regions, Rjfet is a resistance associated with a portion of the common drain layer between depletion regions of the body regions 5, and Repi is a resistance associated with a portion of the drain layer beneath the body regions.

The channel resistance Rc depends on process parameters such as the dopant concentration of the channel region. In other words Rc is proportional to the threshold voltage of the MOS technology power device, and to the channel length. The accumulation region resistance Racc depends on the distance "d" between two adjacent body regions, and decreases as such distance decreases. The Rjfet resistance depends on a resistivity of the common drain layer and on the distance "d" between the body regions, and increases as such a distance decreases. The Repi resistance depends on the resistivity and a thickness of the common drain layer, two parameters which also determine a maximum voltage (Bvmax) that can be sustained by the MOS technology power device. Bvmax increases as the resistivity increases, as long as the epi layer is thick enough. The resistivity and the thickness are optimized for the lowest value of Repi. Further, the output resistance Ron is inversely proportional to an overall channel length of the MOS technology power device. In other words Ron is inversely proportional to a sum of the channel of the individual elementary functional units that make up the MOS technology power device. The longer the channel length per unit area of the MOS technology power device, the lower the output resistant Ron per unit area.

Thus, in order to reduce the Ron it is desirable to scale down the dimensions of the elementary functional units and in particular the distance "d" between the body regions as long as Rjfet is not significantly increased, or in other words to increase a density of elementary functional units per unit area. A reduction of the distance "d" between the body regions has a further advantage of lowering the input and feedback capacitances of the MOS technology power device, thus improving its dynamic performance. Also, in high-voltage MOS technology power devices, reducing the distance "d" between the body regions increases the device's ruggedness under switching conditions. A recent technological trend has therefore been toward increasing the density of elementary functional units per unit area, and MOS technology power devices with a density of up to six million elementary cells per square inch can be fabricated.

The structure of the related art however poses some limitations to the further reduction of the dimensions thereof. These limitations are essentially determined by a resolution and alignment characteristics of the photolithographic apparatus used in the process to manufacture the MOS technology power device. Referring again to FIG. 1, it is known that the dimension "c" must be sufficiently large enough to guarantee that the metal layer 10 contacts the body region, and can only be scaled down to the resolution limit of the photolithographic apparatus used to provide the region "c". In addition, the dimension "b" must be sufficiently large enough to guarantee that the metal layer contacts the source region 6, and must also allow for any alignment errors between the mask defining the contact window 11 in the dielectric layer 9 and the mask for the formation of the source regions. Further, the dimension "t" must be sufficiently large enough to guarantee that the polysilicon layer 8 is electrically insulated from the metal layer and must also take into account any alignment errors between the masks for the definition of the windows 12 in the polysilicon layer and the mask for forming the contact windows in the dielectric layer.

In addition, the structure of the elementary functional units according to the related art does not allow reduction of the distance "d" between the elementary functional units below certain values that depend on a voltage rating of the MOS technology power device. For example, the distance "d" is approximately 5μm for low-voltage devices and in a range from 10μm to 30μm for medium- to high-voltage devices. A reduction of the distance "d" below the specified values would in fact cause a rapid increase in the Rjfet component of the Ron of the MOS technology power device, thereby increasing the value of Ron.

In view of the state of the art described, it is an object of the present invention to provide a new MOS technology power device structure which provides an improvement to the MOS technology power devices of the related art.

SUMMARY OF THE INVENTION

It is an object of the present invention to provide a power device having a higher scale of integration than the MOS technology power devices of the related art. In addition, it is an object of the present invention to provide a power device and a method for manufacturing of the power device that is not limited by the processing and alignment tolerances of the MOS technology power device of the related art. In particular, it is an object to provide a power device having a dimension Lp that is a function of a single feature.

According to the present invention, such objects are attained by a MOS technology power device having a semiconductor material layer of a first conductivity type, a conductive insulated gate layer covering the semiconductor material layer, and a plurality of elementary functional units. The conductive insulated gate layer includes a first insulating material layer placed above the semiconductor material layer, a conductive material layer placed above the first insulating material layer, and a second insulating material layer placed above the conductive material layer. Each elementary functional unit includes a body region of a second conductivity type formed in the semiconductor material layer, wherein the body region is an elongated body region. Each elementary functional unit further includes an elongated window in the insulated gate layer extending above the elongated body region. Each elongated body region includes a source region doped with dopants of the first conductivity type, and intercalated with a body portion of the body region wherein no dopant of the first conductivity type are provided. In addition, each elementary unit includes insulating material sidewall spacers that insulate edges of the elongated window in the insulated gate layer from a metal layer disposed above the second insulating material layer. The metal layer contacts each body region and source region through the elongated window of each elementary functional unit.

In one embodiment of the MOS-technology power device, the source region includes a plurality of source portions of the first conductivity type that extend in a longitudinal direction of the elongated body region and that are intercalated in the longitudinal direction with body portions of the elongated body region. In an alternative of this embodiment, a length of the source portions is greater than a length of the body portions, and the source portions and the body portions of the elongated body region are substantially aligned in a direction transverse to the longitudinal direction respectively with the source portions and the body portions in body regions of adjacent elementary functional units. In another alternative of this embodiment, a length of the source portions is greater than a length of the body portions, and the source portions and the body portions of the body stripe are substantially shifted in the longitudinal direction with respect to the source portions and the body portions in the adjacent body regions of the adjacent elementary functional units.

In another embodiment of the MOS-technology power device, each source region includes a plurality of source portions extending in the longitudinal direction of the elongated body region and intercalated with the body portions of the body region. A length of the source portions is substantially equal to a length of the body portions, and the source portions and the body portions of the elongated body region are substantially aligned in the transverse direction respectively with the body portions and the source portions of the body regions of the adjacent elementary functional units.

In another embodiment of the MOS-technology power device, the elongated body region includes a first longitudinal half-stripe and a second longitudinal half-stripe that are merged together along a longitudinal edge. Each half-stripe includes a plurality of source portions intercalated in the longitudinal direction with body portions of the half-stripe. The source portions and the body portions of the first longitudinal half-stripe are aligned in the transverse direction, respectively, with the body portions and the source portions in the second longitudinal half-stripe.

In another embodiment of the MOS-technology power device, the elongated body region includes a first longitudinal half-stripe and a second longitudinal half-stripe merged together along a longitudinal edge. The first longitudinal half-stripe includes an elongated source portions extending for substantially an entire length of the first longitudinal half-stripe. The second longitudinal half-stripe includes no dopants of the first conductivity type so that the elongated source region is adjacent the body region for the entire length of the elongated body region.

For each of the embodiments of the present invention, the elongated body region of each elementary functional unit, the layout of the source region inside the elongated body region, which allows the source metal layer to contact the source region and the body region along the length of the elongated body regions, and the sidewall spacers of insulating material that seal the edges of the elongated opening in the insulated gate layer from the source metal layer, result in a reduced dimension Lp of the elongated opening in the insulated gate layer in the direction transverse to the length of the elongated body region. Thus each of the embodiments of the present invention have a reduced dimension Lp of each elementary functional unit, and in an increased density of elementary functional units per unit area.

Also according to the present invention, there is provided a process for manufacturing a MOS technology power device, including forming a first insulating material layer over a semiconductor material layer of a first conductivity type, forming a first conductive material layer over the first insulating material layer, forming a second insulating material layer over the first conductive material layer, and selectively removing the second insulating material layer and the first conductive material layer to open at least one elongated window therein. An elongated body region of a second conductivity type is then formed in the semiconductor material layer under the elongated window, and a source region of the first conductivity type is formed in the elongated body region, in such a way as to be intercalated in the longitudinal dimension with a body portion of the elongated body region wherein no dopants of the first conductivity type are provided. Insulating material sidewall spacers are then formed along edges of the elongated window, and a second conductive material layer is provided over the second insulating material layer, and contacts the source region and the elongated body region through the elongated window.

Preferably, the step of forming the elongated body region includes selectively introducing a dopant of the second conductivity type into the semiconductor material layer using the second insulating material layer as a mask, without the need of a dedicated mask for the formation of a heavily doped deep body region at the center of the elongated body regions of the elementary functional units. In addition, the step of forming the source region preferably involves deposition of photoresist layer over the surface of the chip, selective exposition of the photoresist layer to a light source through a photolithographic mask, and selective removal of the photoresist layer from the surface of the chip. The photoresist layer, the second insulating material layer and the first conductive material layer are used as an implantation mask for introducing dopants of the first conductivity type to form the source regions in the body region. The steps for forming the source region eliminate a need to provide a tolerance for any misalignment between the photolithographic mask used for etching the photoresist layer and a photolithographic mask used for finding the elongated window. With this method, the transverse dimension Lp of the elongated opening in the insulated gate layer, is limited only by an optical resolution limit of the photolithographic apparatus used to open the elongated window in the insulated gate layer.

According to the present invention, the objects of the present invention can also be achieved with a MOS-gated power device such as, for example, a MOSFET, an IGBT, a MOS-gated thyristor (MCT) or other MOS-gated power devices. A MOS-gated power device includes a semiconductor material of a first conductivity type that has a plurality of body regions of a second conductivity type formed in a surface of the semiconductor material. A source region of the first conductivity type is formed in a surface of each of the body regions. An insulated gate layer is disposed above the surface of the semiconductor material layer and includes a plurality of windows in the insulated gate layer that are disposed above each of the plurality of body regions. Each window has one dimension that is limited only by an optical resolution limit of a photolithographic apparatus that defines the window. A plurality of sidewall spacers are disposed at edges of the insulated gate layer in the plurality of windows, and seal the insulated gate layer from a metal layer disposed above the insulated gate layer. The metal layer contacts each of the plurality of body regions and each of the plurality of source regions through the plurality of windows.

Further, according to the present invention a process for manufacturing the MOS-gated power device includes providing a semiconductor substrate including the semiconductor material layer of the first conductivity type disposed over a highly doped semiconductor substrate, and forming the insulated gate layer over the surface of the semiconductor material layer. The insulated gate layer is selectively removed to provide the plurality of windows in the insulated gate layer that expose a surface of the semiconductor material layer beneath each of the plurality of windows. Each of the plurality of window has a transverse dimension that is limited only by the optical resolution limit of the photolithographic apparatus used to selectively remove the insulated gate layer to provide the plurality of windows. The plurality of body regions of the second conductivity type are formed in the surface of the semiconductor material layer through the plurality of windows in the insulated gate layer. The source region of the first conductivity type is also formed in each body region through the plurality of windows in the insulated gate layer. The plurality of sidewall spacers are formed along the edge of the insulated gate layer in each window above the surface of the semiconductor material layer, and the metal layer is provided above the insulated gate layer so as to contact each body region and each source region through each window in the insulated gate layer.

Other objects and features of the present invention will become apparent from the following detailed description when taken in connection with the following drawings. It is to be understood that the drawings are for the purpose of illustration only and are not intended as a definition of the limits of the invention.

BRIEF DESCRIPTION OF THE DRAWINGS

The foregoing and other objects and advantages will be more fully appreciated from the following drawing in which.

DETAILED DESCRIPTION

Figure 1:
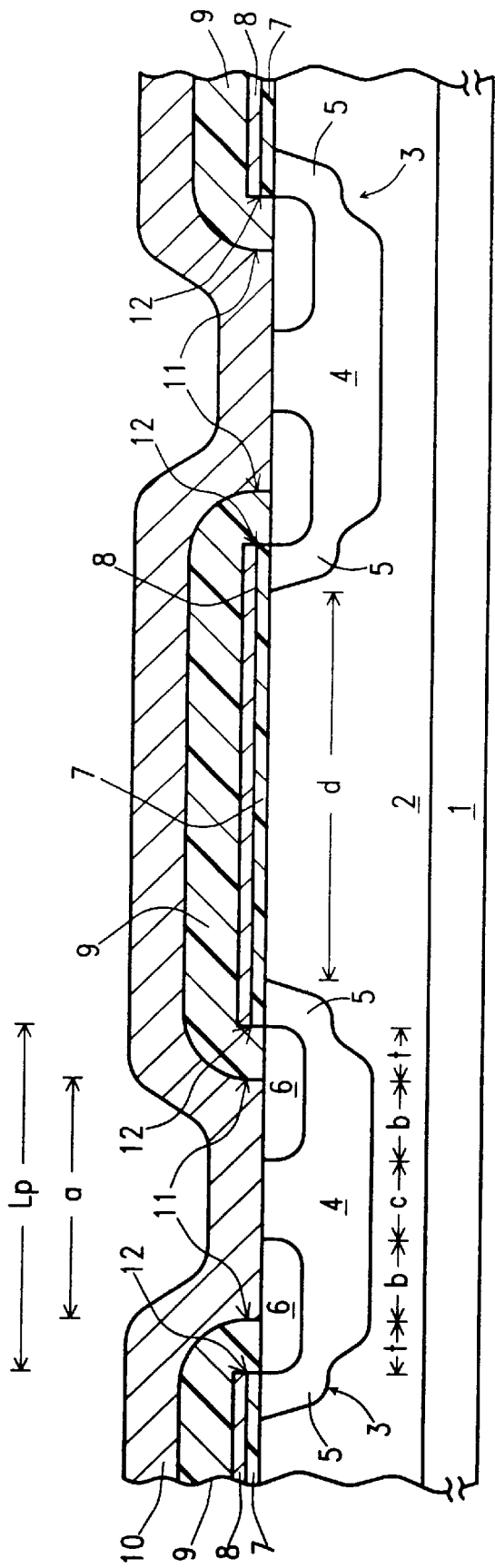
FIG. 1 is a cross-sectional view of a MOS technology power device according to the prior art.

As discussed above, FIG. 1 is a cross-sectional view of a MOS technology power device chip according to the related art. The power device chip includes a heavily doped semiconductor substrate 1, and a lightly doped epitaxial layer 2 of a first conductivity type formed over the semiconductor substrate. The MOS technology power device includes a plurality of elementary functional units formed in the epitaxial layer 2. Two of the elementary functional units are illustrated in FIG. 1.

Each elementary functional units includes a body region 3 of a second conductivity type formed in the epitaxial layer 2. Each body region 3 can have a polygonal layout, such as for example a square or a hexagonal shape, or can be formed as an elongated stripe that has a longitudinal direction in a direction into the Figure. In other words, FIG. 1 is a cross-sectional view in a direction transverse to a length of the elongated stripes. The body region includes a central heavily doped portion 4, called a "deep body region", and a lateral portion 5, having a lower dopant concentration, and which forms a channel region of the elementary functional unit. A doping level of the lateral portion 5 of the body region determines a threshold voltage of the power device. The threshold voltage is the voltage at which the device begins to conduct. Inside each body region 3, is a source region 6 of the same conductivity type as the epitaxial layer 2. A thin oxide layer 7 (a gate oxide layer) and a polysilicon layer 8 cover a surface of portions of the epitaxial layer 2 between the body regions 3 of the two elementary functional units, and extend over the lateral portions 5 of the body regions 3 in each functional unit. A window 12 is provided in the polysilicon and gate oxide layers 8, 7 over the body region 3, and in particular over a surface of each source region and a surface of the deep body region. The polysilicon layer 8 is covered by a dielectric layer 9 in which a contact window 11 is opened over each body region 3, to expose a surface of an inner-portion of each of the source regions and a surface of the deep body region. A metal layer 10 making up the source electrode of the power device is placed over the dielectric layer and contacts the surface of the source regions 6 and the surface of the deep body region 4 through the contact window.

A size of each elementary functional unit of the MOS technology power device is a function of a dimension Lp of the window 12 in the polysilicon layer 8 and the gate oxide layer 7. As discussed above and illustrated in FIG. 1, the dimension Lp is a function of the features "a" and "t" as defined in equation (1):

$$Lp = a + 2t \tag{1}$$

where "a" is the width of the contact window 11 in the dielectric layer 9 and "t" is the distance between an edge of each of the polysilicon layer 8 and gate oxide layer 7 and an edge of the dielectric layer 9. The width "a" of the contact window is defined in equation (2):

$$a = c + 2b \tag{2}$$

where "b" is a distance between an edge of the contact window 11 in the dielectric layer 9 and an inner edge of the source region 6 or in other words the length of the surface of source region available to be contacted by the source metal layer 10, and "c" is the length of the surface of the deep body region wherein the source regions 6 are absent or in other words the distance between the inner edges of the source regions 6 corresponding to the length of the surface of the deep body region 3 available to be contacted by the source metal layer 10. The dimension Lp is therefore given by equation (3):

$$Lp = c + 2b + 2t. \tag{3}$$

The dimension Lp of each elementary functional unit of the related art is therefore determined by the three feature sizes "c", "b" and "t".

As discussed above, it is desirable to reduce the output resistance of the power device in the "on" condition by decreasing the size of each elementary functional unit of the MOS technology power device. In order to reduce the size of each elementary functionally unit, it is desirable to scale down the distance "d" between each of the elementary functionally units thereby resulting in an increase in the density of the elementary functional units per unit area of the MOS technology power device. In addition, as discussed above, the reduction in the distance "d" between the elementary functional units of the MOS technology power device has added advantages of lowering the gate-to-source capacitance (the input capacitance) and the gate-to-drain capacitance (the feedback capacitance) of the MOS technology power device, thereby resulting in an improvement in the dynamic performance of the MOS technology power device. Further, an added advantage of reducing the distance between the elementary functional units for a high-voltage MOS technology power device is that the high-voltage MOS technology power device is more rugged under switching conditions. The distance "d" cannot be reduced too much however, or Rjfet begins to increase. Therefore, it is an object of the power device of the present invention to increase the density of the elementary functional units per unit area.

A problem with the MOS technology power device of the related art illustrated in FIG. 1, is that each of the three features "c", "b", and "t" has a minimum possible size which is determined by a resolution limit and by alignment characteristics of a photolithographic apparatus used in the process of manufacturing the MOS technology power device. In particular, the distance "c" between the inner edges of the source regions must be large enough to provide sufficient area for the metal layer 10 to contact the surface of the deep body region 4. In addition, the distance "b" between the edge of the contact window 11 and the inner edge of each of the source regions 6 must also be large enough to provide an area sufficient for the metal layer 10 to contact the surface of each of the source regions 6, and must also be large enough to account for any alignment errors of the mask used to define the contact window 11 in the dielectric layer and the mask used to form the source regions 6 and the body region 3. Further, the distance "t" between the edges of the polysilicon layer 8 and the oxide layer 7 and the edge of the window 11 in the dielectric layer 9 should be large enough to insure that the polysilicon layer is electrically insulated from the metal layer, and also to take into account any or errors between the mask for defining the window 12 in the polysilicon and oxide layers and the mask for defining the contact window 11 in the dielectric layer. Still further, the distance "d" between each of the elementary functional units is limited by a voltage rating desired for the MOS technology power device. For example, low-voltage power MOS technology power devices typically have the distance "d" of approximately 5 $\mu$m while medium-voltage and high-voltage devices typically have the distance "d" in the range from 10 $\mu$m to 30 $\mu$m. As is known in the related art, reducing the distance "d" below these values results in an increase in the output resistance Ron of the MOS technology power device. Accordingly, the structure of the MOS technology power device of the related art has limits to which the size of each elementary functional unit can be decreased. The power device of the present invention improves upon the MOS technology power device of the related art with a structure that is reduced in size and provides an increased density per unit area.

In the following description, the reference numerals used in FIG. 1 will be used to indicate similar parts.

Figure 2:
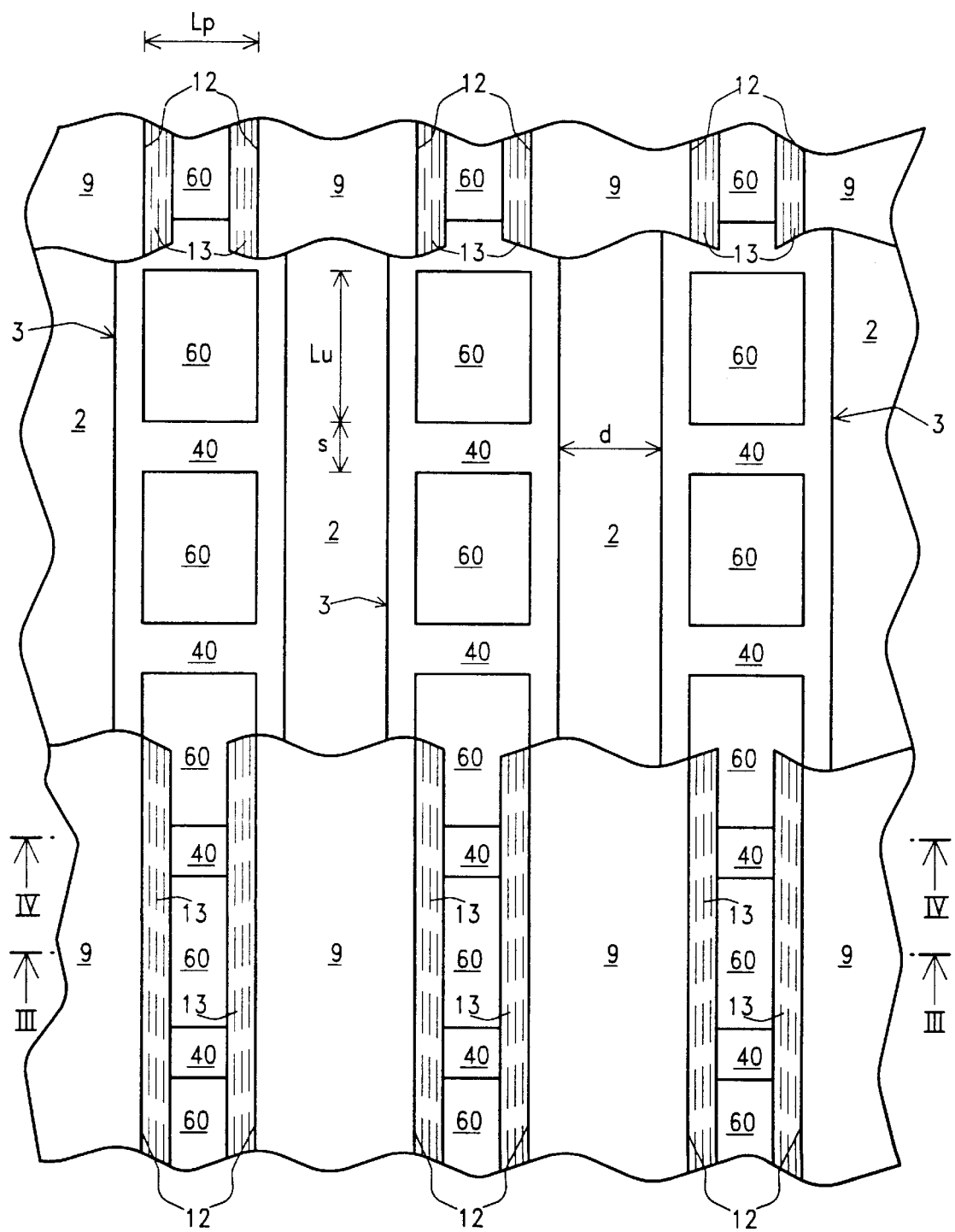
FIG. 2 is a top-plan view of a portion of a MOS technology power device according to a first embodiment of the present invention.
Figure 3A:
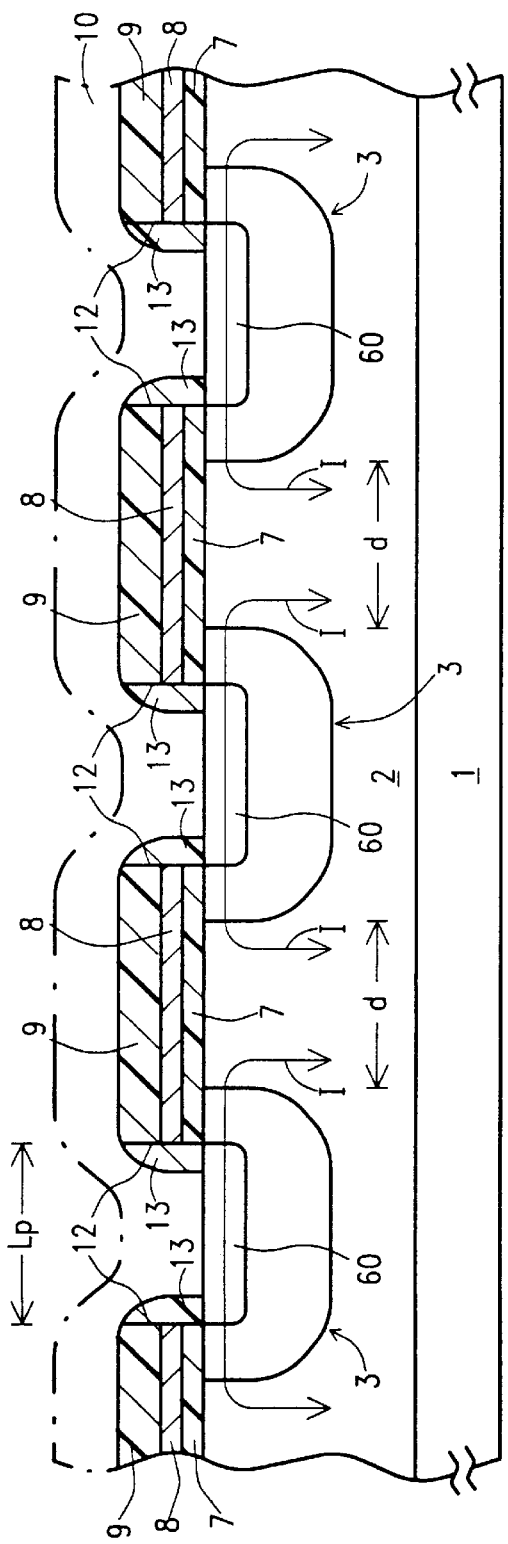
FIG. 3a is a cross-sectional view taken along line III—III in FIG. 2 illustrating a first embodiment of a body region of the first embodiment of the present invention.
Figure 4A:
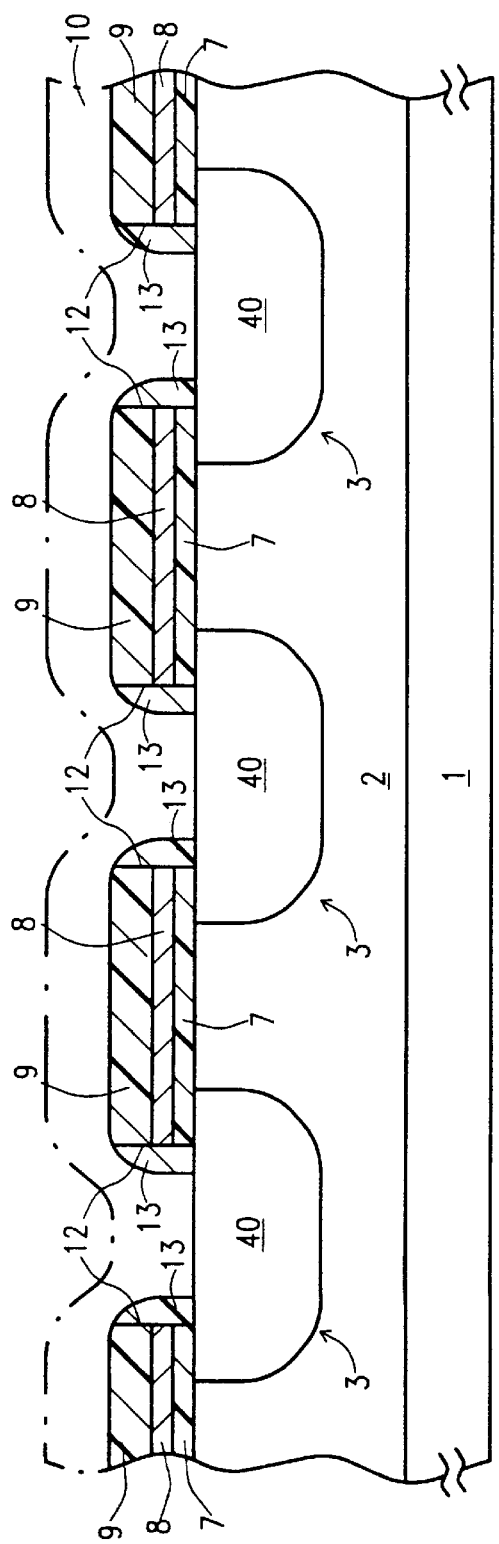
FIG. 4a is a cross-sectional view taken along line IV—IV in FIG. 2 illustrating a first embodiment of a body region of the first embodiment of the present invention.
Figure 3B:
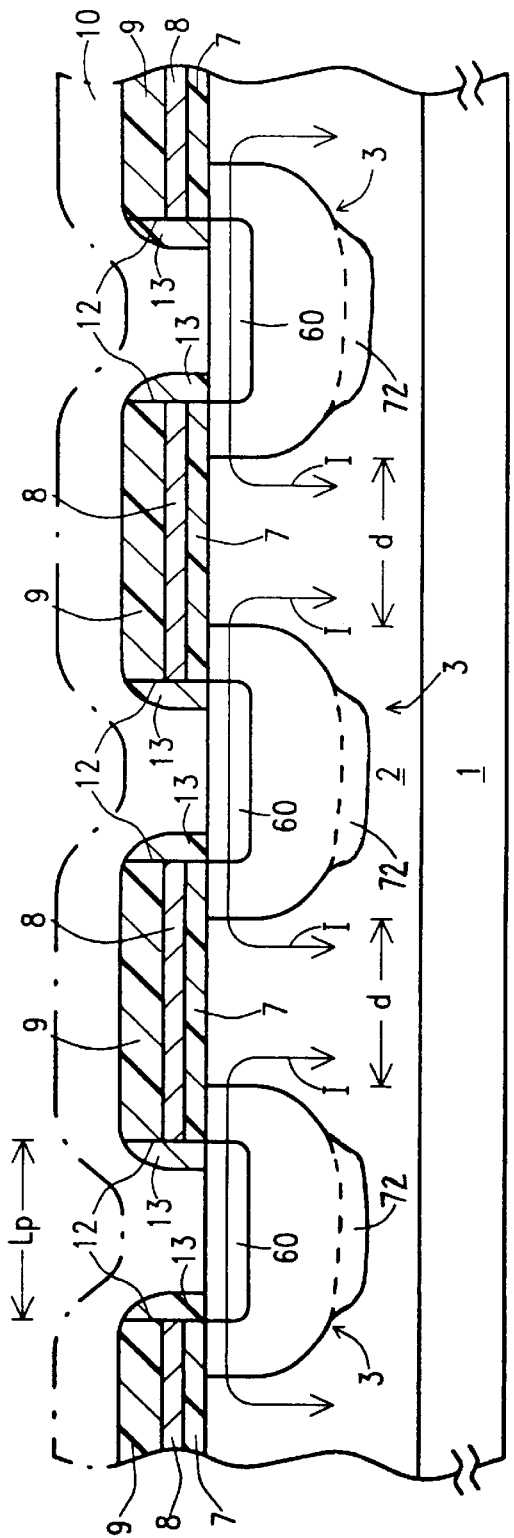
FIG. 3b is a cross-sectional view taken along line III—III in FIG. 2 illustrating a second embodiment of a body region of the first embodiment of the present invention.
Figure 4B:
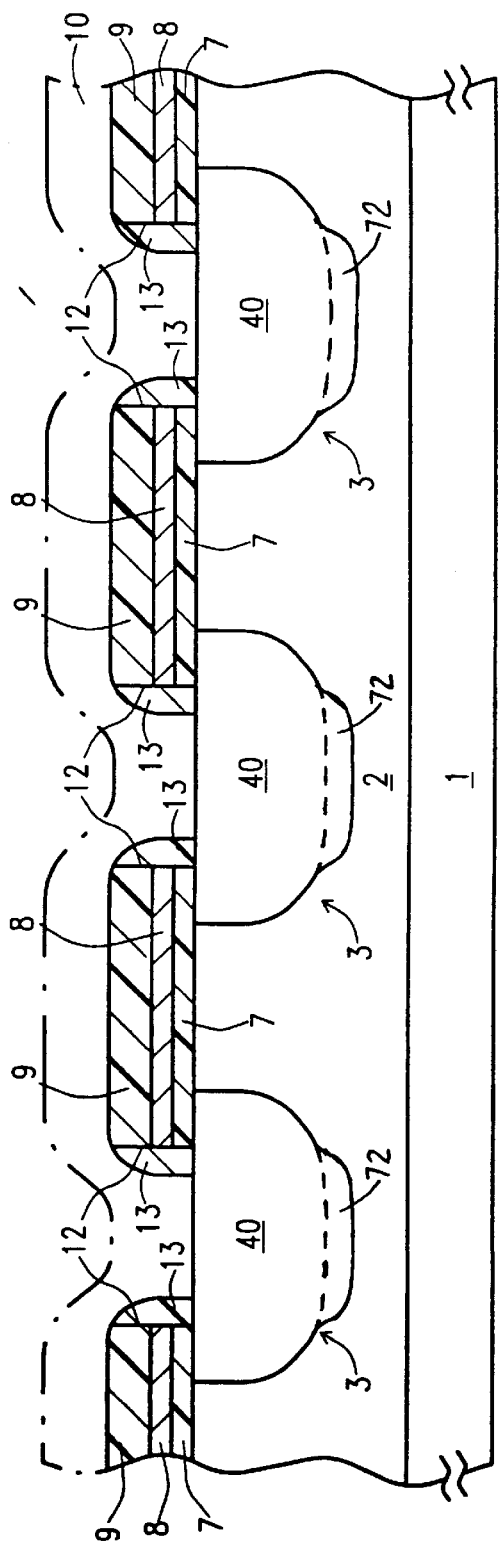
FIG. 4b is a cross-sectional view taken along IV—IV in FIG. 2 illustrating a second embodiment of a body region of the first embodiment of the present invention.

FIG. 2 is a top-plan view of a portion of a MOS-gated power device according to a first embodiment of the present invention. It is to be appreciated that the term MOS-gated power device includes MOSFETS, IGBTs, MOS-gated thyristors (MCT) and other MOS-gated power devices. As illustrated in FIG. 2 the MOS-gated power device comprises a lightly doped semiconductor layer 2 of a first conductivity type, such as for example an epitaxial layer, superimposed over a heavily doped semiconductor substrate 1. FIGS. 3 and 4 are a cross-sectional view taken along lines III—III and IV—IV, respectively of FIG. 2. In particular, FIGS. 3a and 4a illustrate a first embodiment of the body region of the first embodiment of the invention and FIGS. 3b and 4b illustrate a second embodiment of the body region. The epitaxial layer 2 forms a common drain layer of the MOS-gated power device, and can be either of the N conductivity type for an N-channel device, or of the P conductivity type for a P-channel device. For a power MOSFET the substrate 1 is of the same conductivity type as the epitaxial layer 2, whereas for an Insulated Gate Bipolar Transistor (IGBT) the substrate 1 and the epitaxial layer 2 are of opposite conductivity types. The MOS-gated power device includes a plurality of elementary functional units formed in the epitaxial layer 2. Each elementary functional unit includes a body region 3 of the opposite conductivity type of the epitaxial layer 2. As illustrated in FIG. 2, the body regions 3 can be substantially parallel elongated stripes spaced apart by the distance "d" from each other. However, it is to be appreciated that the body regions can be any elongated shape such as, for example, an elongated polygon. Inside each body stripe 3, a plurality of heavily doped regions 60 of the opposite conductivity type from the body stripe 3 are provided. The heavily doped regions 60 extend in the longitudinal direction of the body stripe 3, and are intercalated with body portions 40 of the body stripe 3. The heavily doped regions 60 form source regions of the MOS-gated power device.

A surface of the drain layer 2 is covered by an insulated gate layer including an insulating layer 7, a conductive layer 8 and a passivation layer 9. The insulating layer 7 is typically a thin silicon dioxide layer, and is a gate oxide layer of each elementary functional unit. The conductive layer 8 is typically a polysilicon layer, and is a gate electrode of the MOS-gated power device. In one embodiment of the present invention, a reduced gate resistance of the MOS-gated power device can be provided by reducing a resistance of the gate electrode. For example, the polysilicon layer 8 can be doped with phosphorous or arsenic to reduce the resistance, or alternatively a silicide layer, such as for example of cobalt silicide, can be provided over the polysilicon layer 8. The passivation layer 9 insulates the polysilicon layer 8.

The insulated gate layer formed by the gate oxide layer 7, the polysilicon layer 8 and the passivation layer 9 cover the surface of the epitaxial layer 2 between the body stripes 3, and extends partially over the body stripes 3 to lateral edges of the source region 60 in each body stripe. Elongated openings 12 with substantially vertical walls are provided in the insulated gate layer over a central portion of the body stripes 3, to allow a metal layer 10 (shown in dashed-and-dotted lines in FIGS. 3 and 4) forming a source electrode of the MOS-gated power device to contact both the source regions 60 and the body portions 40 of the body stripes 3 through the elongated openings. Sidewall spacers 13 of an insulating material, such as for example silicon dioxide seal the vertical edges of the elongated openings 12 in the insulated gate layer to isolate the polysilicon layer 8 from the metal layer 10.

Figure 5:
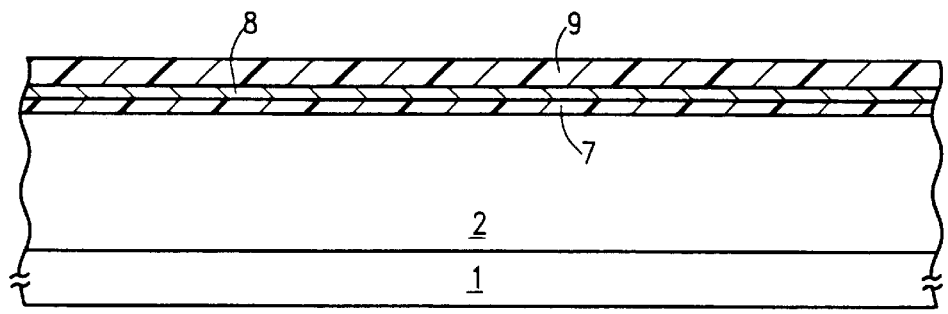
FIGS. 5 to 12 are cross-sectional views illustrating some of the steps of a manufacturing process of the MOS technology power device of FIG. 2.

A process for manufacturing the MOS-gated power device according to the present invention is illustrated in FIGS. 5–12. FIG. 5 illustrates initial steps of epitaxially growing the lightly doped semiconductor layer 2 over the heavily doped semiconductor substrate 1. As previously mentioned, if the power device to be formed is a power MOSFET, the substrate 1 and the epitaxial layer 2 are of the same conductivity type; whereas if an IGBT is to be fabricated, the substrate 1 and the epitaxial layer 2 are of opposite conductivity types. Other MOS-gated power devices may require different combinations of substrates and epitaxial layers and are intended to be within the scope of this disclosure. A resistivity and a thickness of the epitaxial layer 2 grown over the heavily doped semiconductor substrate are chosen to yield a voltage class of the power device. For example low-voltage and high-voltage power devices usually have a resistivity in a range from 0.5 Ohm cm to 100 Ohm cm, and a thickness in a range from 3 $\mu$m to 100 $\mu$m.

In one embodiment, the thin silicon dioxide layer 7 (the gate oxide layer) is then formed over a surface of the epitaxial layer 2, for example by a thermal oxidation process, and the polysilicon layer 8 is then formed over the gate oxide layer 7. However, it is to be appreciated that a conventional process of forming a thick oxide layer over the surface of the epitaxial layer, masking and etching of the thick oxide layer to define active areas of the MOS-gatedapparatus, and forming the thin gate oxide layer over the surface of the epitaxial layer in the active areas, can also be used.

In one embodiment the polysilicon layer is then doped to reduce its resistivity. Alternatively, or even in addition to this, a layer of silicide (for example cobalt silicide) can also be formed over the polysilicon layer 8 by depositing over the surface of the polysilicon layer 8 a layer of cobalt, and by performing a heating process such as submitting the device to a temperature of about 500° C. so that the cobalt and silicon react to form the silicide layer (not illustrated). An advantage of the silicide layer is that the silicide layer greatly reduces the gate resistance of the MOS-gated power device. The passivation layer 9, such as for example an oxide layer formed by a chemical vapor deposition and doped with P-type dopants and known as "PVAPOX", is then formed over the polysilicon layer.

Figure 6:
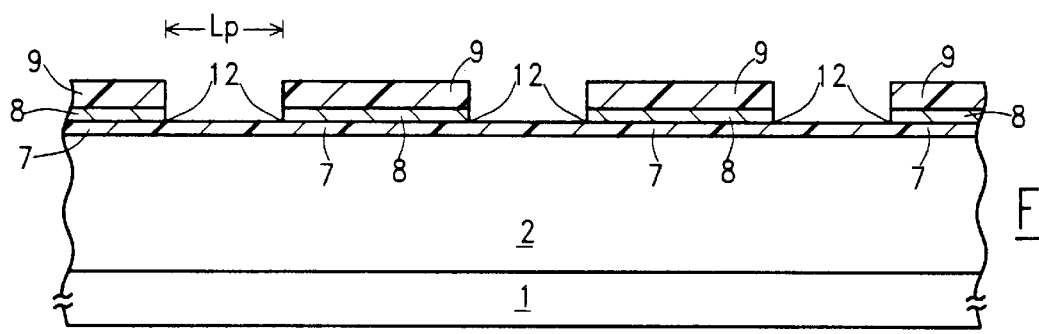
Figure 13:
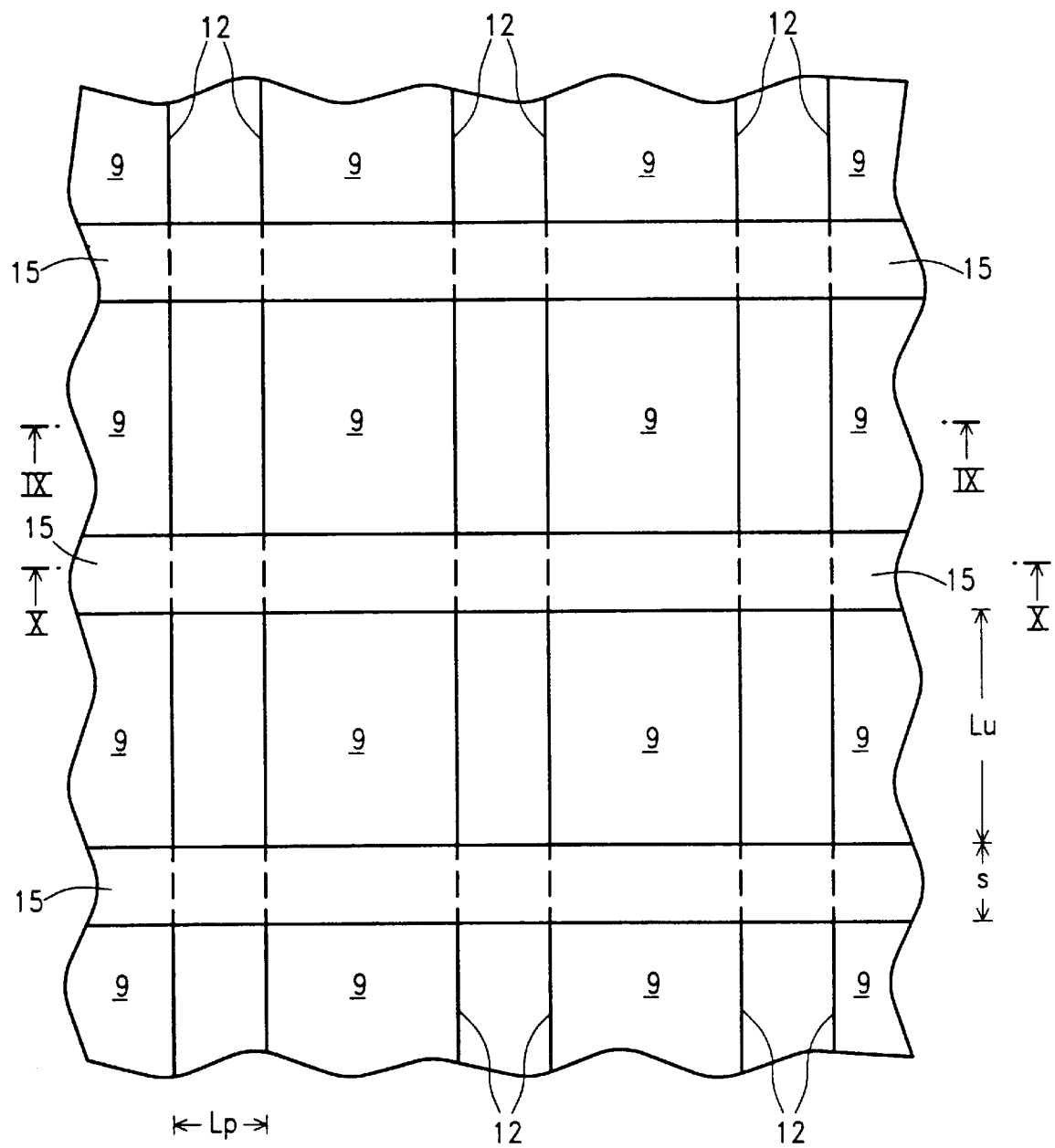
FIG. 13 is a top-plan view of the portion of MOS technology power device shown in FIG. 2, illustrating alignment of some photolithographic masks used for fabricating the device at an intermediate step of the manufacturing process.

Referring to FIG. 6, a photoresist layer is then deposited over the passivation layer 9 (not illustrated), and the chip is selectively exposed by a photolithographic mask to a light source (not illustrated). The photoresist layer is then selectively removed from regions of the passivation layer 9 which are to be etched away (See regions 12 of FIG. 13). The selected regions of the passivation layer 9 and the polysilicon layer 8 are then etched away to form the elongated openings 12 with the substantially vertical walls. It is apparent that the regions of the passivation layer 9 that are still covered by the photoresist layer are not subject to the etching.

Figure 7:
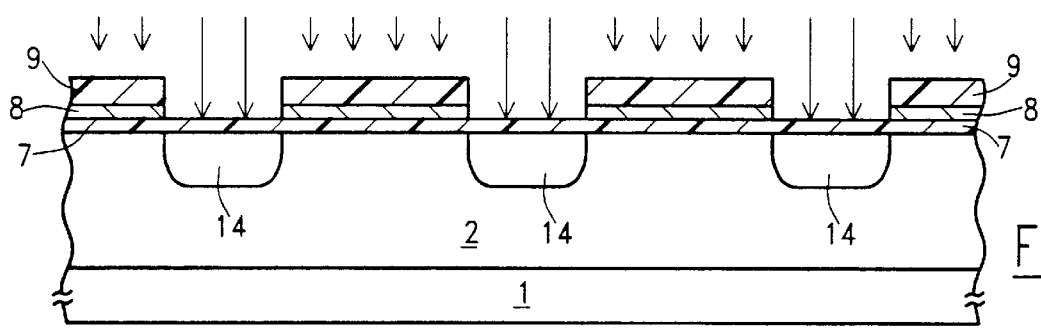

Referring now to FIG. 7, according to a first embodiment of the manufacturing process the body stripes 3 of the second conductivity type having a "bowl-like" shape as illustrated in the cross-sectional views of FIGS. 3 and 4 are then formed in the epitaxial layer 2 under the elongated openings 12. A high dose of a dopant of the second conductivity type is implanted at a high energy into the epitaxial layer 2 through the elongated openings 12. For this implantation step the passivation layer 9 and the underlying polysilicon layer 8 act as an implant mask for the dopant ions. For example, boron ions can be implanted in a dose of $10^{13}$–$10^{15}$cm$^2$ at an energy of 100–300 keV. With the high implantation energy, the regions 14 of the second conductivity type are formed in the epitaxial layer 2 wherein a distribution of implanted ions has a peak concentration located at a prescribed distance from the surface of the epitaxial layer 2. An actual value of the prescribed distance depends on the implantation energy, and preferably the implantation energy is such as to locate the peak concentration of dopants the prescribed distance into the epitaxial layer that is deeper than the source regions which will be formed in a later step. In addition, lateral edges of the regions 14 are aligned with the edges of the elongated openings 12 in the insulated gate layer.

Figure 8:
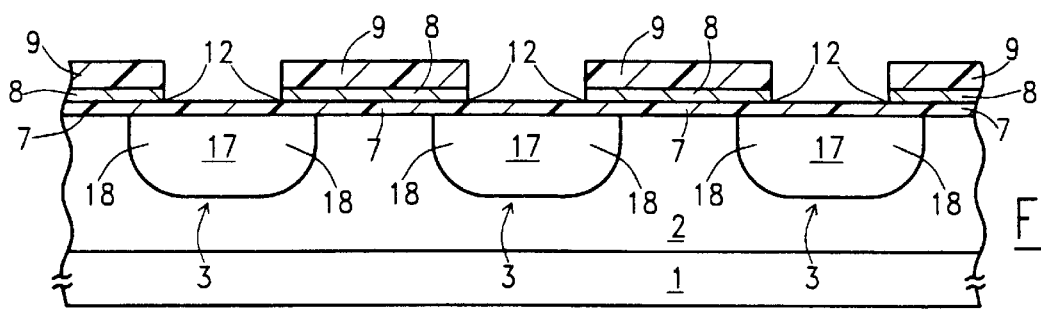

Referring now to FIG. 8, the implanted ions are then made to diffuse laterally and into the epitaxial layer by a thermal process to form the body stripes 3. The thermal process has a temperature and a time duration chosen in such a way that the body stripes 3 have a central heavily doped deep body stripe 17, which is formed by vertical diffusion of the dopants into the epitaxial layer, having elongated edges substantially aligned with the edges of the elongated openings 12, and two lateral lightly doped channel stripes 18 laterally extending under the gate oxide layer 7, which are formed by lateral diffusion of the dopants into the epitaxial layer. A suitable thermal process can be for example at a temperature of 1050–1100° C. for 0.5–2 hours. Thus, the process uses only one boron doping step and does not need multiple steps as in the related art. In addition, the edges of the body stripes are self-aligned to the edges of the polysilicon gate layer and the dielectric layer and do not need a mask to form the body stripes. An advantage of the "bowl-like" body region shape is that the process for forming it requires one less masking than the body region shape of the related art device shown in FIG. 1. In particular, the body region shape shown in FIG. 1, as discussed above, is formed by implanting the central heavily doped deep body regions through a first mask, opening the elongated windows 12 in the gate oxide layer and the polysilicon layer, and then implanting the lightly doped portions of the body regions through the elongated windows.

As an alternative, the body stripes 3 having the "bowl-like" shape can be formed by two distinct implants of dopants of the second conductivity type into the epitaxial layer 2, in different doses and at different energies, again using the passivation layer 9 and the underlying polysilicon layer 8 as an implantation mask for both the implants. For example, a first implant can involve a dose of dopants in the range $10^{13}$–$10^{14}$ atoms/cm$^2$ with an energy of approximately 80 keV to provide a dopant concentration at the surface of the body stripes, for example in the channel portions. In particular, the first dopant can be used to set the desired threshold voltage of the MOS-gated power device. It is to be appreciated that although it is not needed there may also be a thermal diffusion step between this first implant and the second implant. A second implant can then be for example a dose of a dopant in the range $10^{14}$–$10^{15}$ atoms/cm$^2$ with an energy in a range between 100 keV and 300 keV, such that a peak concentration of the dopants can be located at the prescribed distance, namely at the distance deeper than the source regions which will be formed in the later step. A thermal diffusion at a temperature in the range for example from 1050–1100° C. for 0.5 to 2 hours is then performed to provide the lateral diffusion of the dopant introduced with the first implant to form the channel portions of the body stripes extending under the gate oxide layer. Any vertical diffusion of the dopant introduced with the second implant during this thermal diffusion step does not alter the threshold voltage of the MOS-gated power device, because any dopant ions that reach the surface of the epitaxial layer have a concentration lower than the concentration of the dopant introduced with the first implant, since the peak dopant concentration of the dopant introduced with the first implant is located substantially at the surface of the drain layer 2. The vertical and lateral diffusion of the dopants introduced with the second implant form the heavily doped deep body regions of the body stripes. This process also has the advantages of providing a central heavily doped deep body stripe that is self-aligned with the edges of the elongated windows, and one less masking step than the process and structure of the related art.

Figure 9:
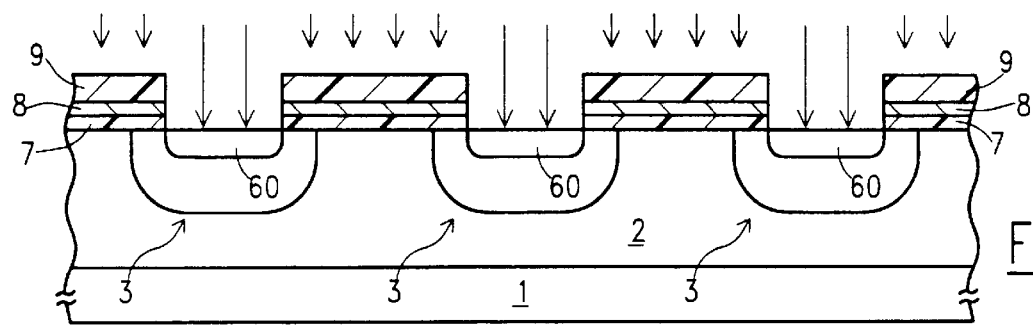
Figure 10:
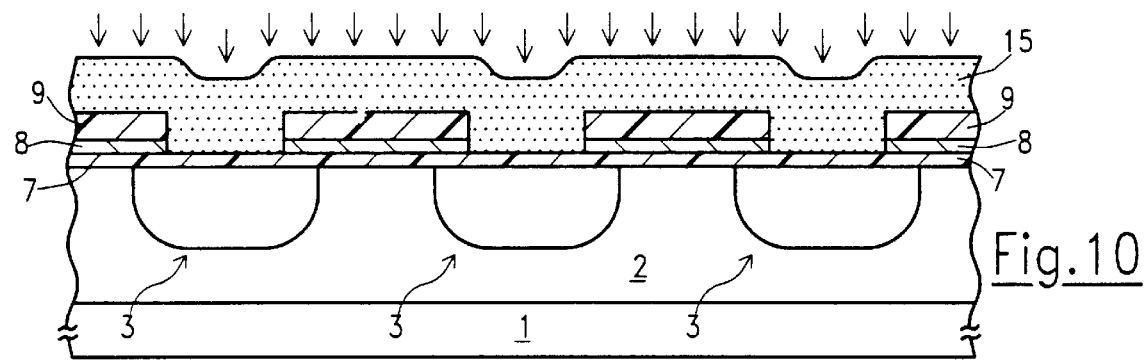

Referring now to FIGS. 9–10, which respectively show cross-sectional views of the body region not covered by a photoresist layer and covered by the photoresist layer 15, after the body stripes 3 have been formed, dopants of the first conductivity type are selectively introduced in the body stripes 3 in a heavy dose to form the source regions of the power device. This step involves the deposition of the photoresist layer 15 over the surface of the chip, and the selective exposition of the chip to a light source through a photolithographic mask. The pattern of the photolithographic mask is thus transferred to the photoresist layer 15. The photoresist layer 15 and the gate oxide layer 7 are then selectively removed from the surface of the chip, to obtain the pattern of the photoresist layer shown in FIG. 13. The photoresist layer 15, together with the passivation layer 9, act together as implantation masks, for the dopants of the first conductivity type. With these steps, the source regions 60 are formed in the body region 3 as illustrated in FIG. 9 and are intercalated in the longitudinal direction of the body stripes 3 with the body portions 40 of the body stripes as illustrated in FIG. 10.

One advantage of the process of manufacturing the MOS-gated power device according to the present invention is that should a misalignment exist between the photolithographic mask used for defining the pattern of the photoresist layer 15 and the photolithographic mask used for defining the elongated openings 12, it does not have any effect on the final structure, because even in case of an alignment error the source regions 60 will nevertheless still be intercalated in the longitudinal direction of the body regions 3 with the body portions 40 of the body regions. In other words, the transverse dimension of the structure of the present invention is not being relied upon to establish connection of the metal layer 10 to each of the source region and the body region. Instead the longitudinal dimension is used to provide these contacts.

It is to be appreciated that the source regions within each body region, can also be formed by using a silicon etching step to etch portions of a source region diffused in the body region. For example, the source region may be implanted as an elongated stripe within the elongated body region. The body portions of the body region can then be formed by etching through the source stripe to the underlying body region to provide the plurality of body portions and source regions within the body region.

According to one embodiment of the process of manufacturing the MOS-gated power device, the body region as illustrated in FIGS. 3b and 4b is formed by implanting a dopant of the second conductivity type such as, for example, boron at an energy suitable to form a highly doped region below the "bowl-like" region. For example, boron ions can be implanted in a range of $1\times10^{14}$ to $5\times10^{15}$ atoms/cm$^2$ at an energy in a range from 200 keV to 3 MeV so as to form the region 72 of the second conductivity type below the body region 3. It is to be appreciated that an alternative process of forming the body region as illustrated in FIGS. 3b and 4b is to implant a high dose of a dopant of the second conductivity type at a plurality of different energies to form a plurality of highly doped regions within and below the existing "bowl-like" body region. For example, a first implant of boron ions can be in a range of $1\times10^{14}$ to $5\times10^{15}$ atoms/cm$^2$ at an energy range of 1 MeV to 3 MeV and, a second implant of boron ions can be in a range of $1\times10^{14}$ to $5\times10^{15}$ atoms/cm$^2$ at an energy of 300 keV to 600 keV so as to provide a plurality of gaussian distributions overlapping one another at a plurality of distances from the surface of the epitaxial layer and so as to form the deep body regions illustrated in FIGS. 3b and 4b.

It is to be appreciated that although the step for forming the deep-body region 72 of the body region 3 has been illustrated as being performed after the source regions are formed in the body region, this step can be performed at any point in the process after the selected regions of the passivation layer 8 and the polysilicon layer 9 have been removed to form the elongated openings 12, as illustrated in FIG. 6. However, it is to be appreciated that the later in the process that the implant of the deep-body region is performed, the less lateral and vertical diffusion that will occur as a result of temperature from subsequent processing steps. It is also to be appreciated that the implant of the deep body region can be performed in a self-aligned manner as discussed above wherein the polysilicon layer and the passivation layer are used as the implantation mask, or alternatively the implant can be performed after depositing a photoresist masking layer in a selected pattern for defining the deep-body regions.

Figure 11:
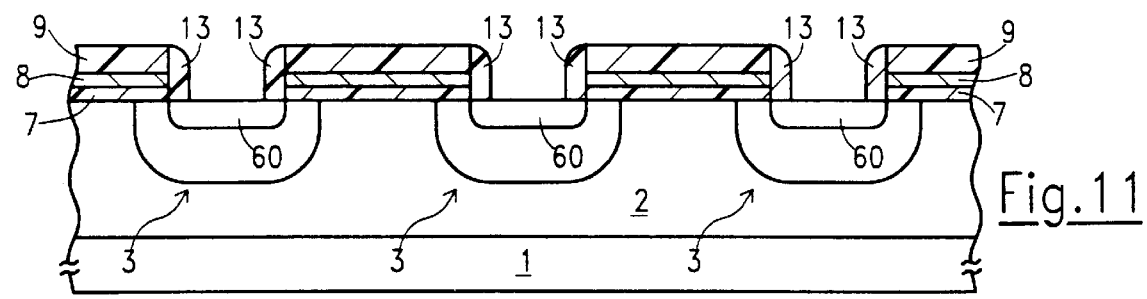
Figure 12:
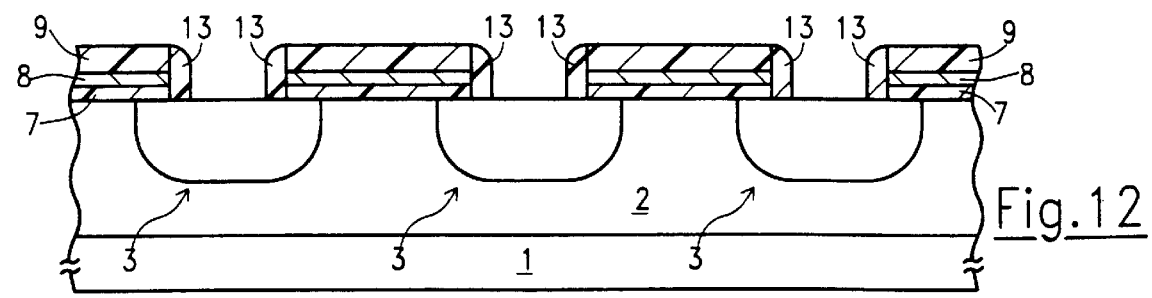

Referring now to FIGS. 11–12, which are the cross sectional views of FIGS. 3a and 4a, respectively, there is illustrated the body regions 3 containing the source portions 60 and the body portions, respectively. The photoresist layer 15 and the underlying portions of the gate oxide layer 7 are then removed. The oxide sidewall spacers 13 are formed along the vertical edges of the elongated openings 12 in the passivation layer 9, the polysilicon layer 8 and the gate oxide layer 7 by forming an additional dielectric layer (not shown) over the whole surface of the device and by an anisotropic etch of the additional dielectric layer so as to maintain the spacers at the edges of the elongated openings. The passivation layer 9 and the sidewall spacers 13 electrically isolate the polysilicon layer 8 from the metal layer 10. The metal layer is then deposited over the passivation layer 9 and it is selectively removed to define a source electrode of the power device (not illustrated).

The structure of the present invention is different from the related art structure, wherein the dimension Lp of the window 12 of the elementary functional units is determined by the three feature sizes "c", "b", and "t" (Lp=c+2b+2t). In the structure of the present invention the dimension Lp of the elementary functional unit of the present invention is determined by one feature size only. In particular, a reduction of the number of feature sizes determining the dimension Lp from three to one is a consequence of three circumstances, as will be now described.

First, as previously described in connection with FIG. 1, in the related art structure the polysilicon layer is insulated from the source metal layer by the dielectric layer 9 in which the contact windows 11 are opened by a photolithographic mask distinct from the mask used for defining the windows 12 in the polysilicon layer. Thus, one feature size determining the dimension Lp of the windows in the polysilicon layer of the structure of the related art is the distance "t" (FIG. 1) between the edge of the window 12 in the polysilicon layer and the edge of the contact window 11 in the dielectric layer. As discussed above, the distance "t" must be sufficiently large to guarantee the electrical insulation of the polysilicon layer 8 from the source metal layer 10 and to take into account any alignment tolerance between the two photolithographic masks. It is to be appreciated that the corners of the contact windows 11 in the related art are the critical regions that help define this limit. In contrast, in the structure of the present invention the polysilicon layer 8 is insulated from the source metal layer 10 vertically by the passivation layer 9, which is etched simultaneously with the polysilicon layer to form the elongated openings 12, and laterally by the sidewall spacers 13 of insulating material-sealing the vertical edges of the elongated openings 12. The sidewall spacers are self-aligned and thus no alignment tolerance is needed to provide them. In other words, the windows in the insulated gate layer that are opened to form the body region and the source region, are also the windows for forming the contact between the source metal plate and each of the body regions and source regions. Thus, the mask of the related art and the tolerance requirements for opening the contact windows in the dielectric layer are eliminated with the process of the present invention, and there is no need to provide the distance "t" between the edge of the window in the polysilicon layer 12 and the edge of the contact window 11 of the related art. Therefore the dimension Lp is not a function of the feature size "t".

Second, because the elementary functional units include the elongated body stripes with source regions 60 intercalated in the longitudinal direction with body portions 40 of the body stripe, the contact of the source metal layer 10 to both the source regions and to the body stripes is provided in the longitudinal direction. This eliminates the problems associated with the related art structure shown in FIG. 1. In particular, it is not necessary with the structure of the present invention to provide the distance "b" between the edge of the contact window 11 in the dielectric layer and the inner edge of the source regions. Therefore, the dimension Lp of the structure of the present invention is not a function of the feature size "b".

Third, the way in which the deep body stripes are formed according to the present invention eliminates the need for the mask for the formation of the deep body region as required in the process of the related art. In particular, as discussed above, the related art requires a first mask internal to the openings 12 in the polysilicon layer, that is used to introduce the high dose of dopants into the semiconductor layer 2 to form the central portion of the deep body regions while avoiding lateral diffusion of the dopants in the channel regions and a second mask (the elongated windows in the insulated gate layer) for implanting the low does of dopants to form the lateral lightly doped regions. In contrast in the process of the present invention, the insulated gate layer is used as the mask for introducing the dopants to create the body region, and no other mask is needed.

With the structure and method of manufacturing of the present invention, the dimension Lp of the elongated openings 12 in the insulated gate layer including the gate oxide layer 7, the polysilicon layer 8 and the passivation layer 9 can be scaled down to the optical resolution limit "f" of the photolithographic apparatus used to define the openings 12. In other words, in the structure according to the present invention, the minimum value of Lp is "f". By comparison, as discussed above, the related art structure minimum value of Lp is c+2b+2t, because the dimension of the elementary functional unit is determined by the three feature sizes.

As an example of a reduction in size and thus in an increased density of the power device unit of the present invention that is accomplished with the structure and the process of manufacturing the power device of the present invention, if the photolithographic apparatus used to fabricate the MOS-gated power device involves exposition of the entire chip at one time, it is possible to shrink the dimension Lp from approximately 8µm, achievable with the related art structures and corresponding to an equivalent density of elementary cells of 3.5 millions cells per square inch, to about 2.6 µm, which corresponds to an equivalent density of about 10 millions cells per square inch. If instead the photolithographic apparatus is a stepper type, involving the exposition of only a portion of the chip at a time, a further reduction of Lp to approximately 1 µm or less is possible, corresponding to an equivalent density of elementary cells of about 30 million cells per square inch.

Referring to FIG. 2, it can be appreciated that the channel perimeter of the MOS-gated power device is proportional to the ratio:

$$Lu/(Lu+s)$$

where Lu is a length of a source region 60 in the longitudinal direction of the body stripe 3, and "s" is the distance between two consecutive source regions 60, or in other words "s" is a length of the body portions 40 of the body stripes wherein the source regions are absent. The body portions 40 of the body stripes 3 are functionally inactive areas of the MOS-gated power device in that they do not contribute to the overall current conduction of the power device. As previously mentioned the "on" resistance Ron of the output resistance of the MOS-gated power device is inversely proportional to the overall channel perimeter of the power device, thus a smallest Ron is achieved by making "s" as small as possible and Lu as large as possible. A minimum value for "s" is given by an optical resolution limit "f" of the photolithographic apparatus, while a maximum value for Lu depends on the particular technology and voltage rating desired of the MOS-gated power device. In addition, the greater the distance Lu between two consecutive contacts to the body stripe 3 via the body regions 40, the higher the base resistance of a parasitic bipolar junction transistor that is intrinsically associated with the structure formed by the source regions 60, the body stripe 3 and the epitaxial layer 2, and the lower the maximum current that the MOS-gated power device can withstand during switching. As a consequence, the greater the distance Lu, the greater the likelihood that the MOS-gated power device cannot sustain a maximum specified voltage. Accordingly, there is a tradeoff between the Ron of the device and the maximum current capacity of the device, and the values of Lu and "s" should be selected accordingly.

In the embodiment of the present invention illustrated in FIGS. 2–4, the source regions 60 in adjacent body stripes 3 are aligned in a transversal direction of the body stripes. In other words. the source regions 60 and the body regions 40 in one body stripe are respectively aligned in the direction transverse to the length of the body regions 3 with the source regions and the body regions in the elongated body regions of the adjacent elementary functional units. In the epitaxial layer 2 between the adjacent body stripes 3 there are two current fluxes I as illustrated in FIG. 3, which run from facing source regions 60 in the adjacent body stripes 3. The distance "d" between adjacent body stripes 3 cannot therefore be reduced beyond a certain limit or Rjfet increases dramatically.

Figure 14:
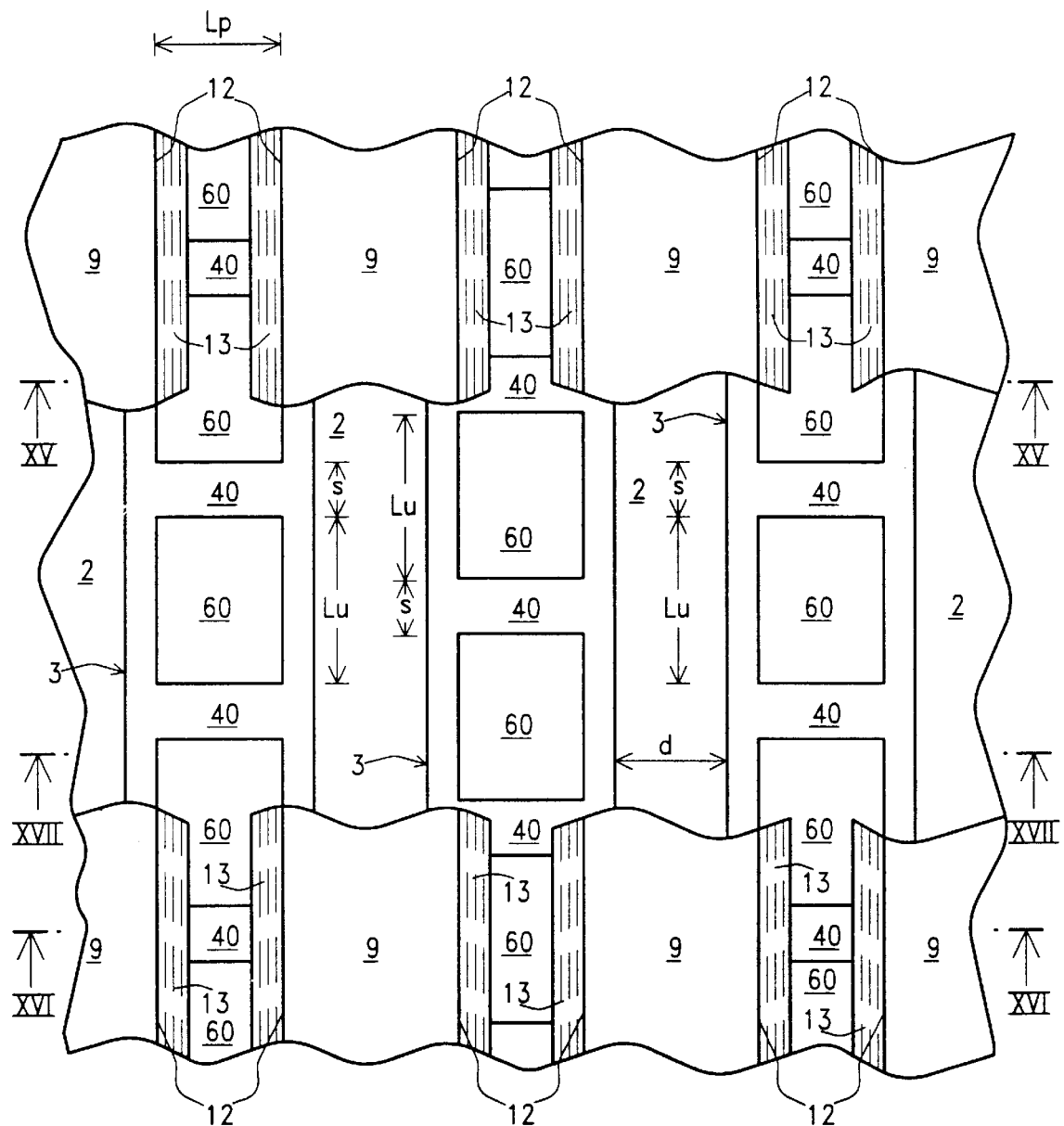
FIG. 14 is a top-plan view of a portion of a MOS technology power device according to a second embodiment of the present invention.
Figure 15:
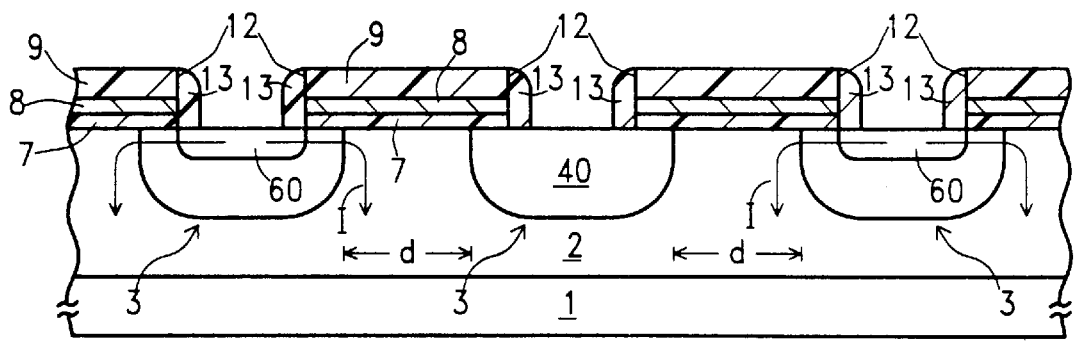
FIG. 15 is a cross-sectional view along line XV—XV in FIG. 14.
Figure 16:
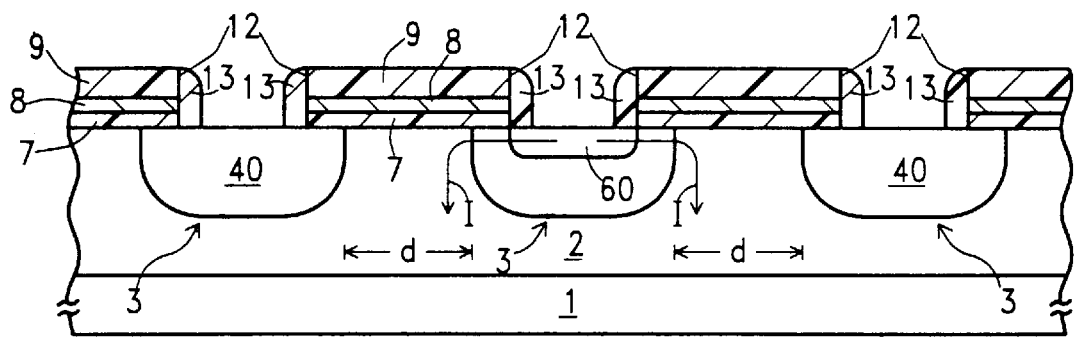
FIG. 16 is a cross-sectional view along line XVI—XVI in FIG. 14.
Figure 17:
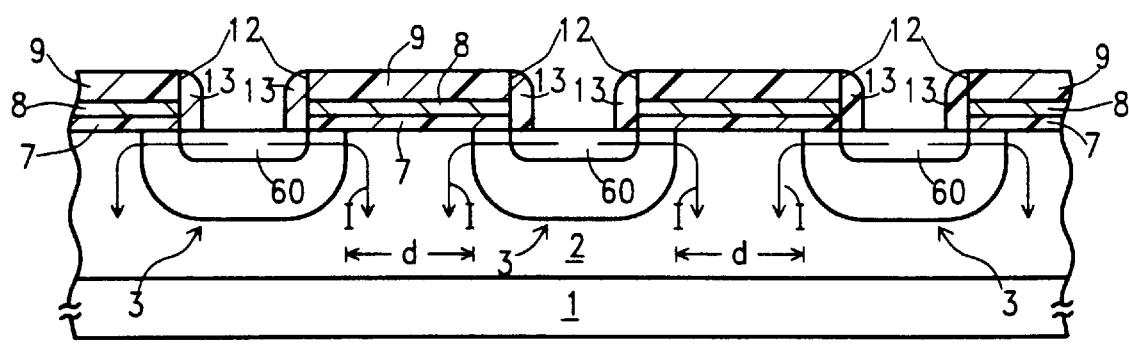
FIG. 17 is a cross-sectional view along line XVII—XVII in FIG. 14.

FIG. 14 is a top-plan view of a portion of a MOS-gated power device according to a second embodiment of the present invention. FIGS. 15, 16 and 17 illustrate cross-sectional views of the epitaxial layer 2 taken along lines XV—XV, XVI—XVI, and XVII—XVII, respectively. This embodiment is substantially similar to that of FIG. 2, except that the source regions 60 in a given body stripe 3 are shifted in the longitudinal direction with respect to the source regions 60 in the adjacent body stripes 3. With the structure of this embodiment, as illustrated in the cross-sectional views of FIGS. 15, 16 and 17, there are portions of the epitaxial layer 2 between adjacent body stripes 3 wherein there is only one current flux I running either from the source region 60 of one body stripe 3 or from the source region 60 of an adjacent body stripe 3. With this arrangement, it is possible to slightly reduce the distance "d" between the body stripes 3 without increasing the resistance component Rjfet between depletion regions of the elementary functional units, which contributes to the overall resistance of the Ron. The increased integration density provides an increase of the overall channel perimeter per unit area. However, since as discussed above in order to maximize the channel perimeter of the device the dimension s should be small compared with the dimension Lu, any reduction in the distance "d" should also should be small, because the majority of portion of the epitaxial layer 2 between the body stripes 3 will have a current flow of two current fluxes I as illustrated in the cross-sectional view of FIG. 17.

Figure 18:
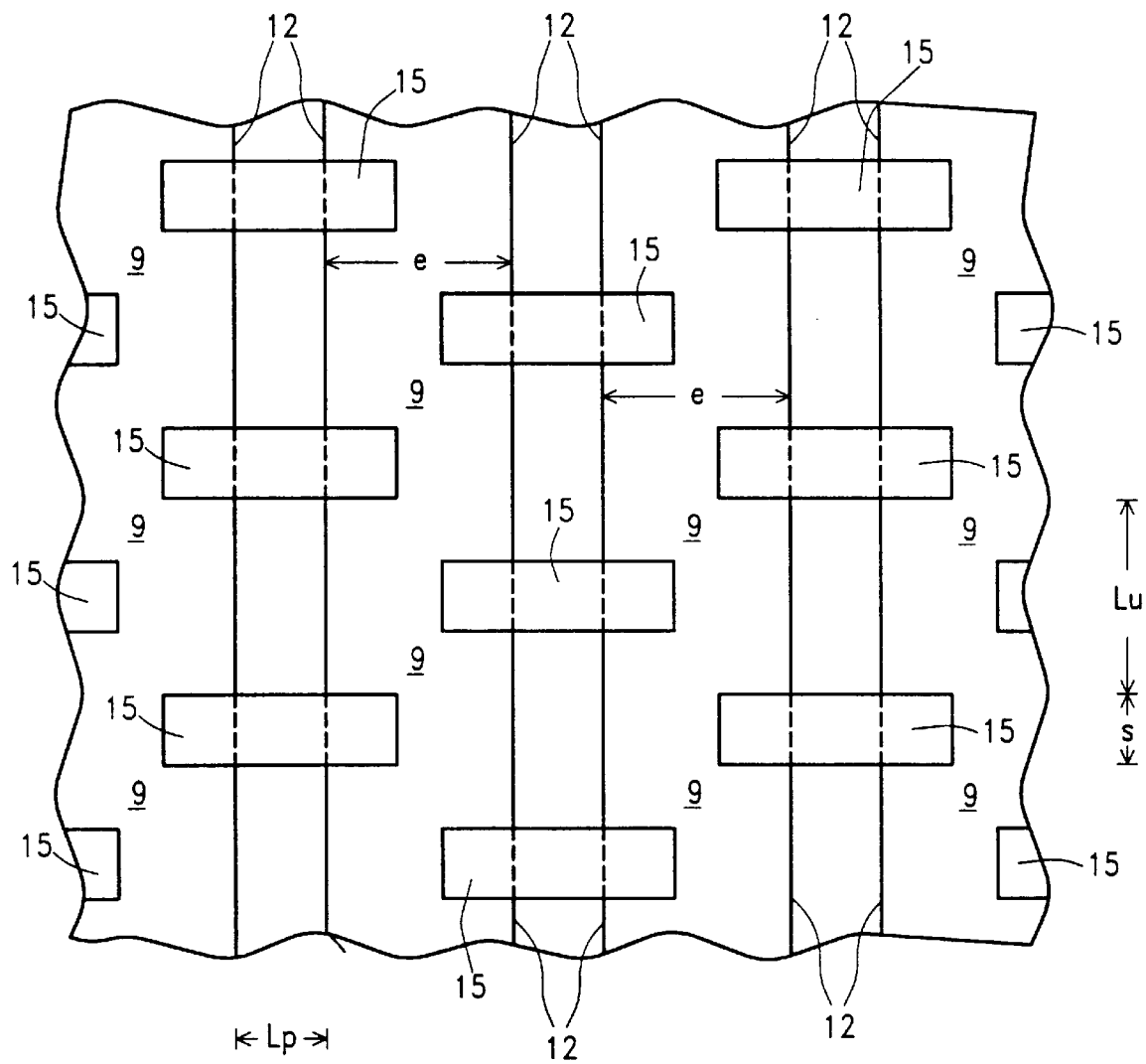
FIG. 18 is a top-plan view of the portion of MOS technology power device shown in FIG. 14, illustrating alignment of some photolithographic masks used for fabricating the device at an intermediate step of the manufacturing process.

The MOS-gated power device according to this second embodiment can be fabricated by the same manufacturing process previously described. The only difference is in the photolithographic mask used in the step of forming of the source regions, which instead results in the photoresist pattern 15 as shown in FIG. 18. With this embodiment of the present invention a distance "e" between adjacent elongated openings 12 in the polysilicon and passivation layers 8 and 9 should be larger than twice an alignment tolerance Lt of the photolithographic apparatus, to prevent a misalignment in the transversal direction between the mask for defining the pattern in the photoresist layer 15 and the mask for the definition of the elongated openings 12. However, this does not adversely affect the reduction in size achieved with the present invention because the alignment tolerance of a photolithographic apparatus is normally smaller (approximately ⅓ or ¼) than its optical resolution limit "f," and the dimension "e" is normally larger than the optical resolution limit "f" of the photolithographic apparatus. For example, using a stepper photolithographic apparatus with an optical resolution limit "f" approximately equal to 1 µm, the alignment tolerance Lt is approximately 0.3 µm.

In addition, it is to be appreciated that although FIGS. 14–17 illustrates the body stripes 3 as having the "bowl-like" shape as illustrated in the cross-sectional views of FIGS. 3a and 4a, the body regions may also be formulated with the body region shape as illustrated in FIGS. 3b and 4b.

Figure 19:
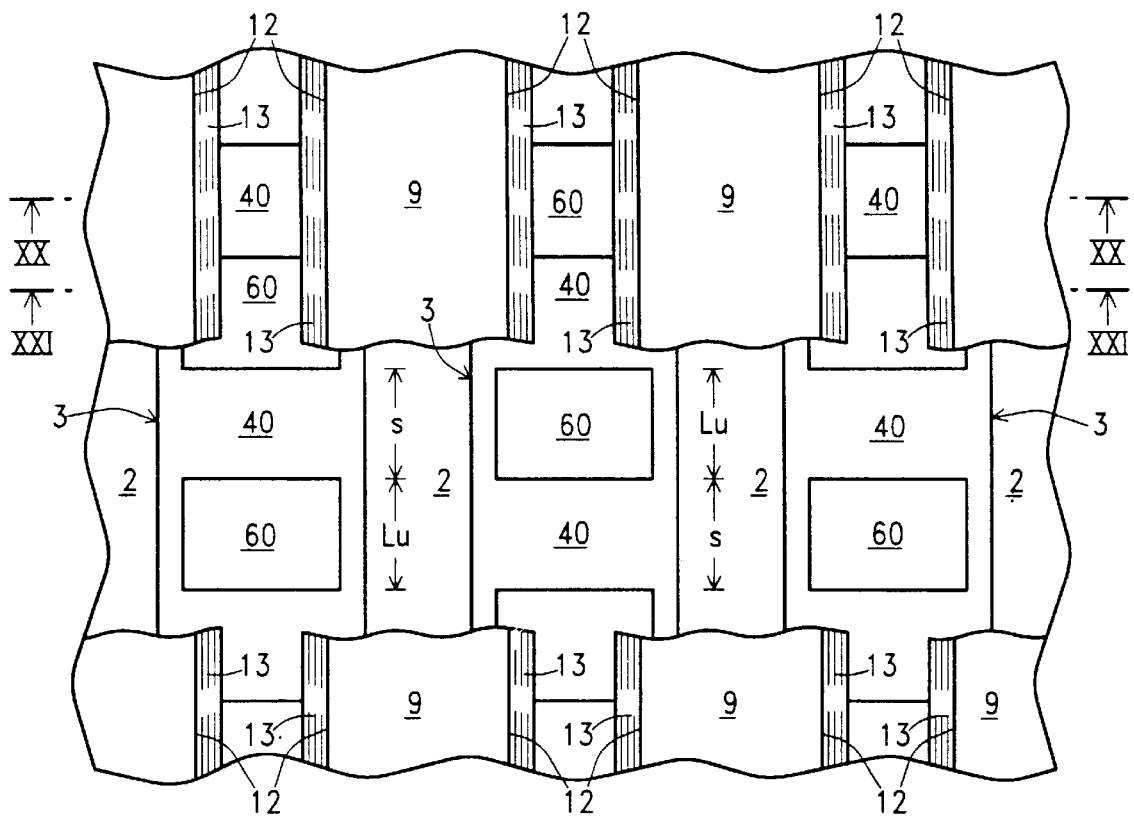
FIG. 19 is a top-plan view of a portion of a MOS-technology power device according to a third embodiment of the present invention.

FIG. 19 is a top-plan view of a portion of a MOS-gated power device according to a third embodiment of the invention. In this embodiment the length "s" of the body portions 40 of the body stripes 3 wherein the source regions 60 are absent is the same length as the length Lu of the source regions 60. The channel perimeter for a single elementary functional unit is therefore approximately one half of that achievable with the structures of the previous two embodiments. However, this embodiment has an advantage for example with respect to the embodiment of FIGS. 2–4, in that the distance "d" between adjacent body stripes 3 can be reduced to one half. This reduction in the distance "d" is possible because the source regions 60 of a given body stripe 3 always face the body portions 40 of the adjacent body stripes 3. As illustrated in the cross-sectional views of FIGS. 20–21, which are taken along lines XX—XX and XXI—XXI of FIG. 19 respectively, the portions of the epitaxial layer 2 between the body stripes 3 are always intersected by a current flux I coming from only one source region. An advantage of this embodiment of the present invention is that the reduction of the distance "d" between the body stripes 3 leads to a lowering of the feedback capacitance of the MOS-gated power device, because the area between the polysilicon layer 8 and the common drain layer 2 is reduced in half. This is of great benefit for the dynamic performance of the device. It is also to be appreciated that the reduction of the distance "d" between adjacent elementary functional units provides an increase of the integration density, and thus an overall channel perimeter per unit area of this embodiment is higher than that achievable with structures of the previous two embodiments.

Figure 22:
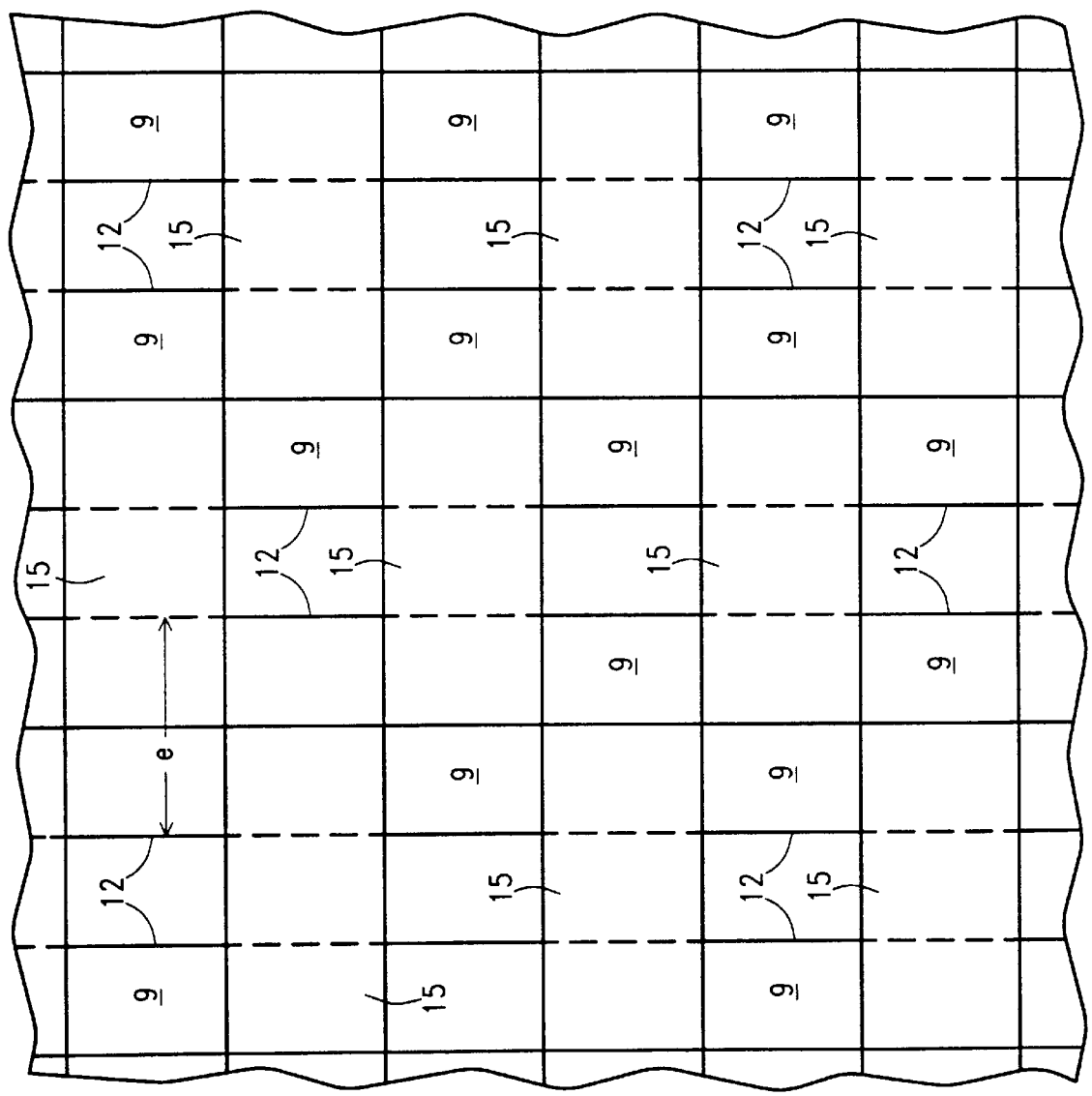
FIG. 22 is a top-plan view of the portion of MOS technology power device shown in FIG. 19, illustrating alignment of some photolithographic masks used for fabricating the device at an intermediate step of the manufacturing process.

The MOS-gated power device according to this third embodiment can be fabricated by the same manufacturing process previously described. The only difference is in the layout of the photolithographic mask used in the step of formation of the source regions, which results in the pattern of photoresist 15 shown in FIG. 22. As is the case with the second embodiment illustrated in FIG. 14, the distance "e" between adjacent elongated openings 12 in the passivation layer 9 and polysilicon layer 8, should be greater than twice the alignment tolerance Lt of the photolithographic apparatus in use, to take into account the possible alignment errors between the masks. However, as was discussed above, this does not adversely affect the reduction in size achieved with this embodiment because the alignment tolerance Lt is approximately ¼ of the optical resolution limit. In addition, even though this embodiment allows a significant reduction of the distance "d" between adjacent body stripes 3, the dimension "e" is larger than the optical resolution limit of the photolithographic apparatus.

It is also to be appreciated that although FIGS. 19–23 illustrate the third embodiment of the present invention as having the "bowl-like" shape as shown in FIGS. 3a and 4a, the body regions can also have the body region shape as illustrated in FIGS. 3b and 4b.

Figure 23:
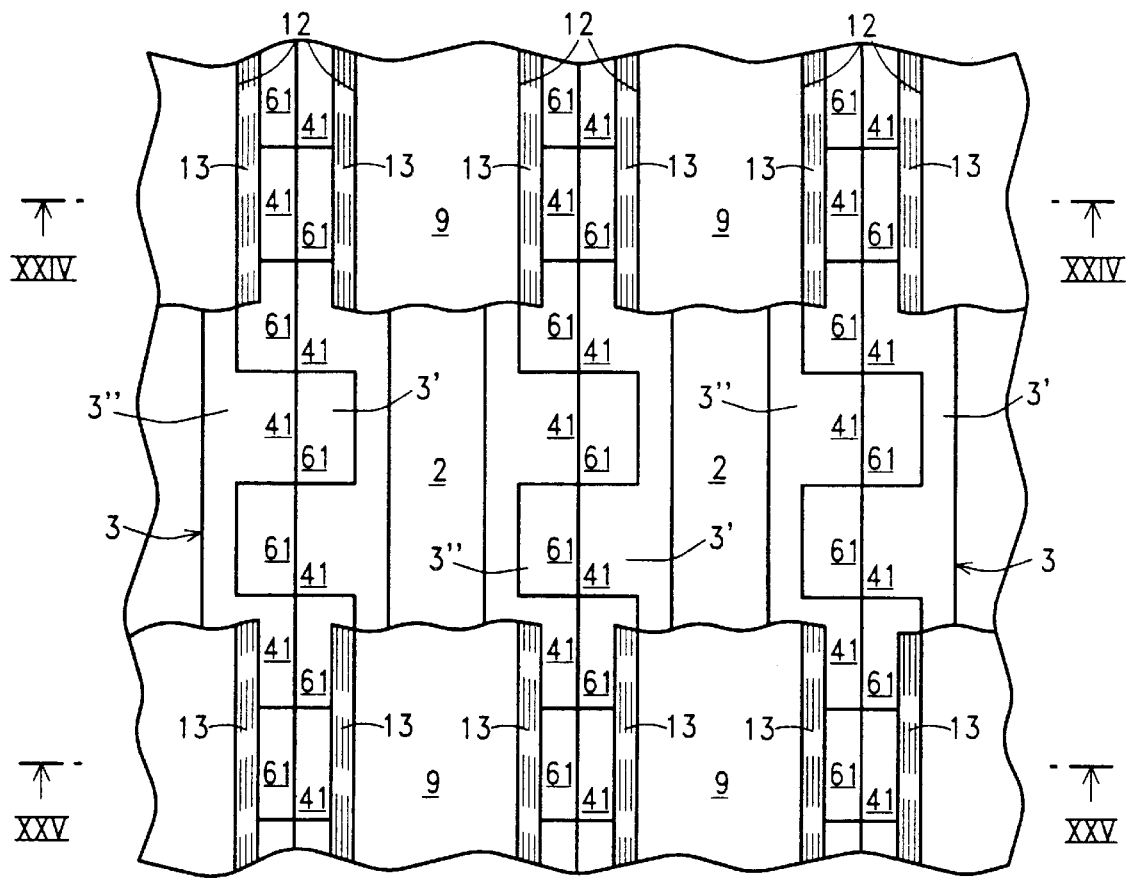
FIG. 23 is a top-plan view of a portion of a MOS technology power device according to a fourth embodiment of the present invention.

FIG. 23 is a top-plan view of a portion of a MOS-gated power device according to a fourth embodiment of the invention. In this embodiment, each body stripe 3 is divided into two longitudinal half-stripes 3'and 3", and in each half-stripe source regions 61 of the opposite conductivity type of the body stripe 3 are intercalated in the longitudinal direction with body portions 41 of the half-stripe wherein the source regions are absent. In addition, the source regions 61 in one half-stripe are contiguous to the body portions 41 of the other half-stripe, and face the body portions 41 of adjacent body stripes 3.

Figure 20:
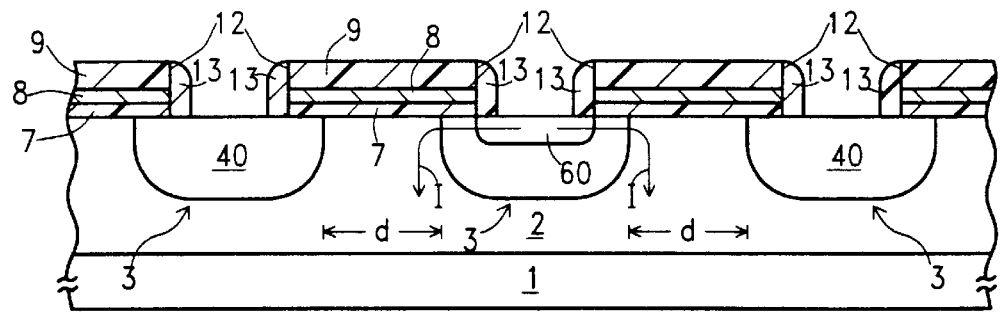
FIG. 20 is a cross-sectional view along line XX—XX in FIG. 19.
Figure 21:
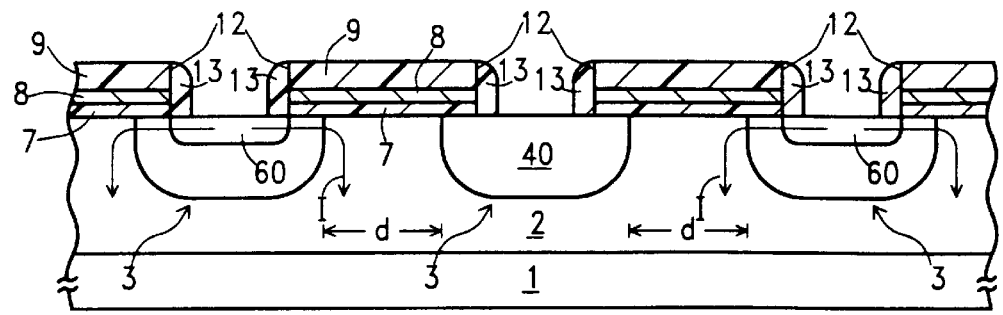
FIG. 21 is a cross-sectional view along line XXI—XXI in FIG. 19.
Figure 24:
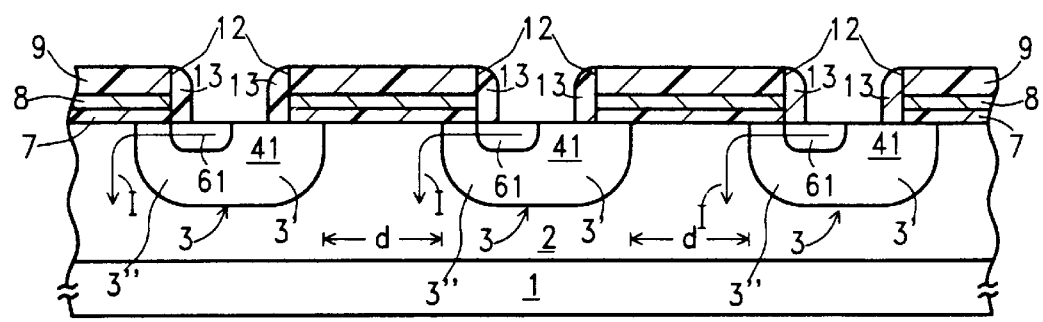
FIG. 24 is a cross-sectional view along line XXIV—XXIV in FIG. 23.
Figure 25:
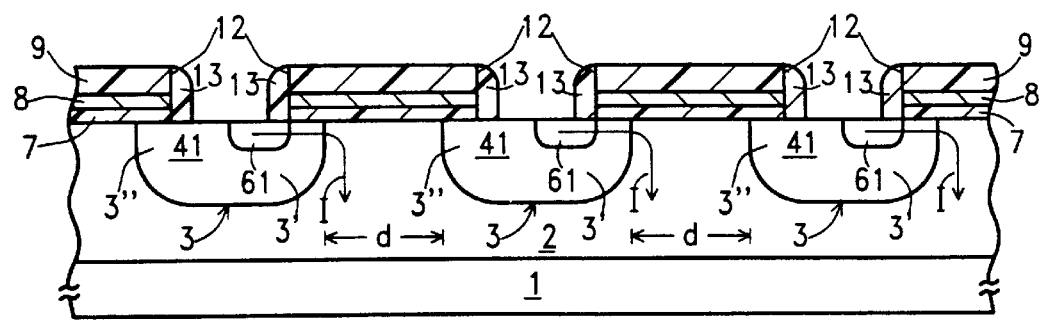
FIG. 25 is a cross-sectional view along line XXV—XXV in FIG. 23.

As is the case with the structure illustrated in FIGS. 19–21, the arrangement of this embodiment allows a reduction in the distance "d" between adjacent body stripes, because the portions of the epitaxial layer 2 between the adjacent body stripes 3 are always interested by a current flux I from only one source portion. FIGS. 24 and 25 are cross-sectional view taken along lines XXIV—XXIV and XXV—XXV of FIG. 23, respectively, and illustrate the single current flux I in the epitaxial layer.

An advantage of this embodiment with respect to the previous three embodiments is that the source metal layer 10 (not shown) contacts the body stripes 3 and the source regions 61 along their whole length, instead of at regularly spaced intervals having the length equal to Lu. This results in an increased ruggedness of the MOS-gated power device. For example, a base-emitter resistance of a parasitic bipolar junction transistor associated with the structure formed by the source regions, the body stripes and the epitaxial layer is minimized.

Figure 26:
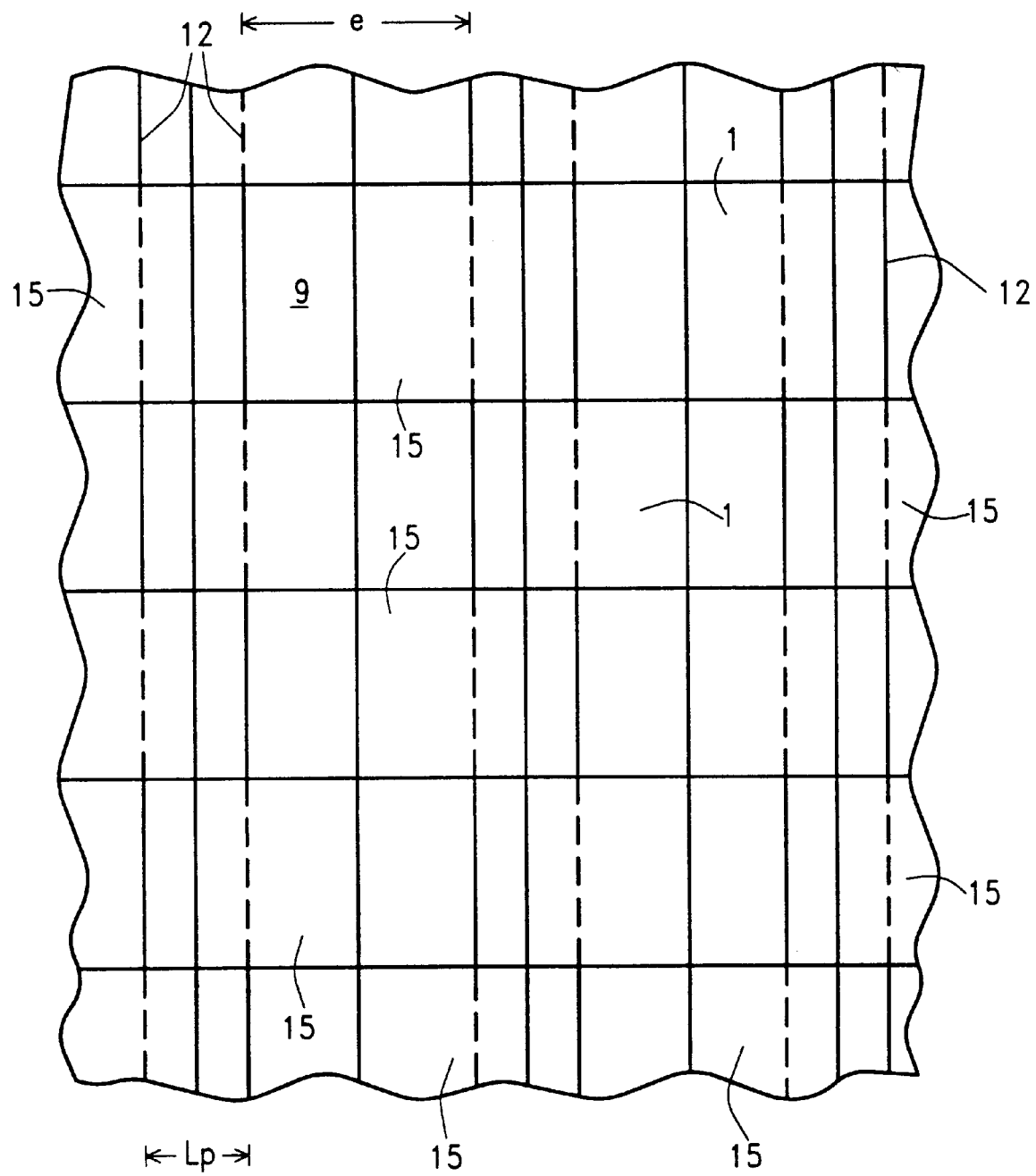
FIG. 26 is a top plan view of the portion of MOS-gated power device shown in FIG. 23, illustrating alignment of some photolithographic masks used for fabricating the device at an intermediate step of the manufacturing process.

The fourth embodiment of MOS-gated power device can be fabricated by the manufacturing process previously described, wherein the only difference is in the layout of the mask used to form the source regions which results in the pattern of photoresist 15 shown in FIG. 26. It can be appreciated that the layout of the source mask is substantially the same as that of FIG. 22, the only difference being for this embodiment not only should the distance "e" between adjacent elongated openings 12 be greater than twice the alignment tolerance Lt of the photolithographic apparatus in use, but also the dimension Lp of the elongated openings should be greater than 2Lt, to prevent any alignment errors between the source mask and the mask for defining the elongated openings 12. However, since the minimum value for the dimension Lp is the optical resolution limit of the photolithographic apparatus, and since the alignment tolerance Lt is approximately ¼ the optical resolution limit, the additional possibility of alignment errors between the masks does not pose a limit to the shrinking of the size of the elementary functional units with this embodiment. An advantage of this embodiment of the present invention is that the contact of the source metal layer (not shown) to the source regions 61 and to the body portions 41 is guaranteed even if the dimension Lp of the elongated openings 12 is reduced to the optical resolution limit of the photolithographic apparatus.

It is to be appreciated that although FIGS. 24–25 illustrate the fourth embodiment as having the "bowl-like" body region shape as illustrated in FIGS. 3a and 4a, the body regions can lso have the body region shape as illustrated in FIGS. 3b and 4b.

Figure 27:
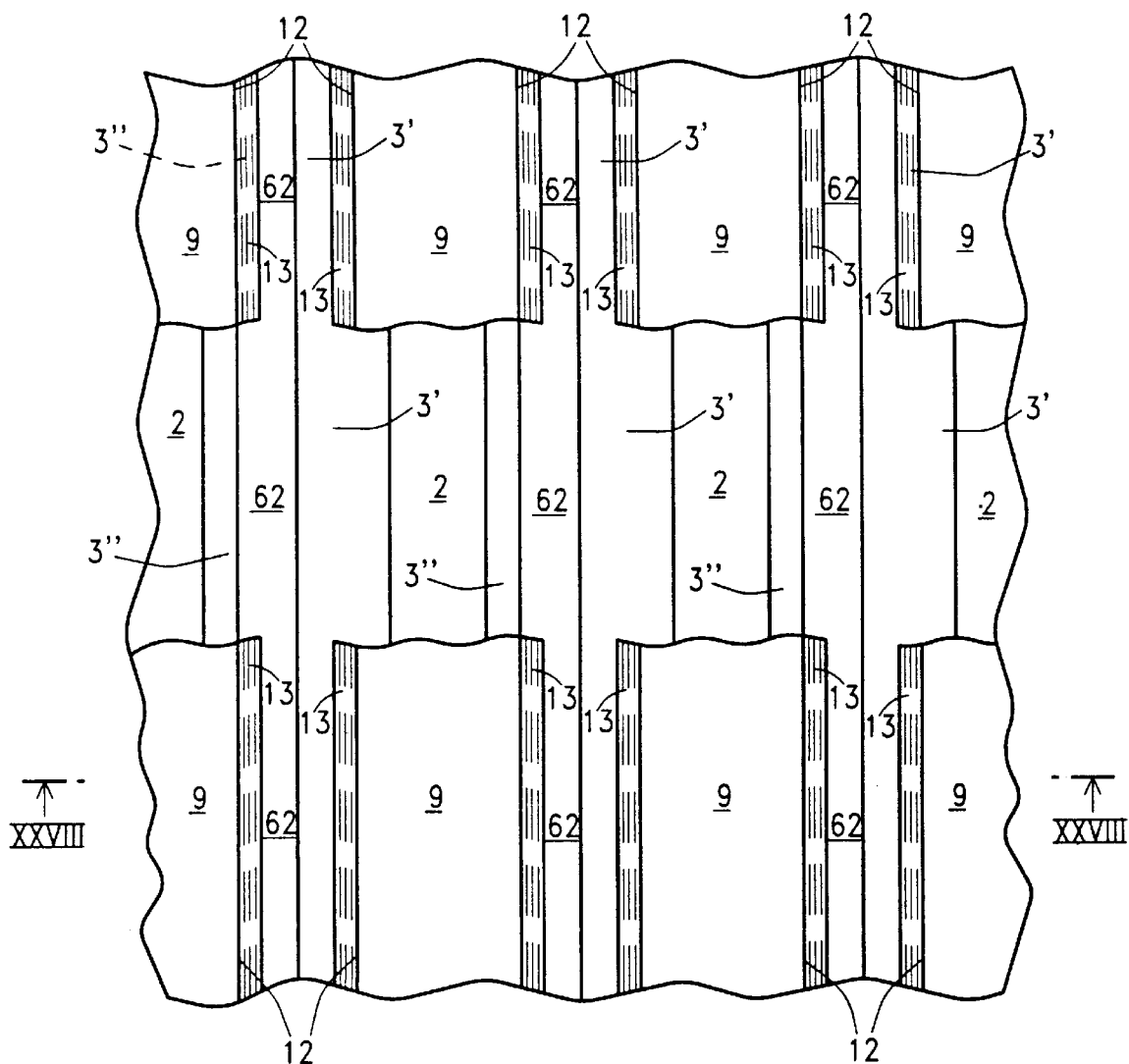
FIG. 27 is a top plan view of a portion of a MOS technology power device according to a fifth embodiment of the present invention.
Figure 28:
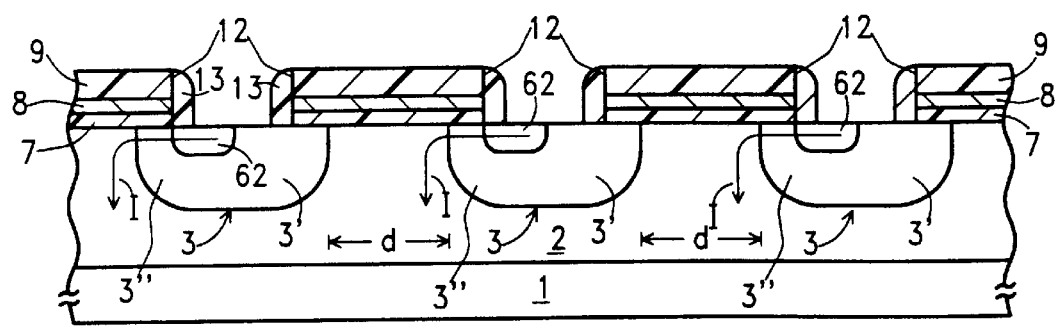
FIG. 28 is a cross-sectional view along Line XXVIII—XXVIII in FIG. 27.

FIG. 27 is a top-plan view of a MOS-gated power device according to a further embodiment of the present invention. As in the case of the embodiment illustrated in FIG. 23, each body stripe 3 is divided in two half-stripes 3'and 3 ". In a first half-stripe of the two halfstripes a source region 62 is provided that extends substantially for an entire length of the body stripe 3, while in a second half-stripe no source region is provided. FIG. 28 is a cross-sectional view taken along line XVIII—XVIII of FIG. 27. As illustrated in FIG. 28 and as discussed above with the arrangement of FIGS. 23–25, it is possible with this embodiment to reduce the distance "d" between adjacent body stripes, because in the portions of the drain layer 2 between adjacent body stripes there is a current flux I coming from only source region. In addition, as discussed above with respect to the fourth embodiment, an advantage of this embodiment is an increased ruggedness of the MOS-gated power device, because the body stripe 3 and the source region 62 are contacted by the source metal layer along the entire length.

Figure 29:
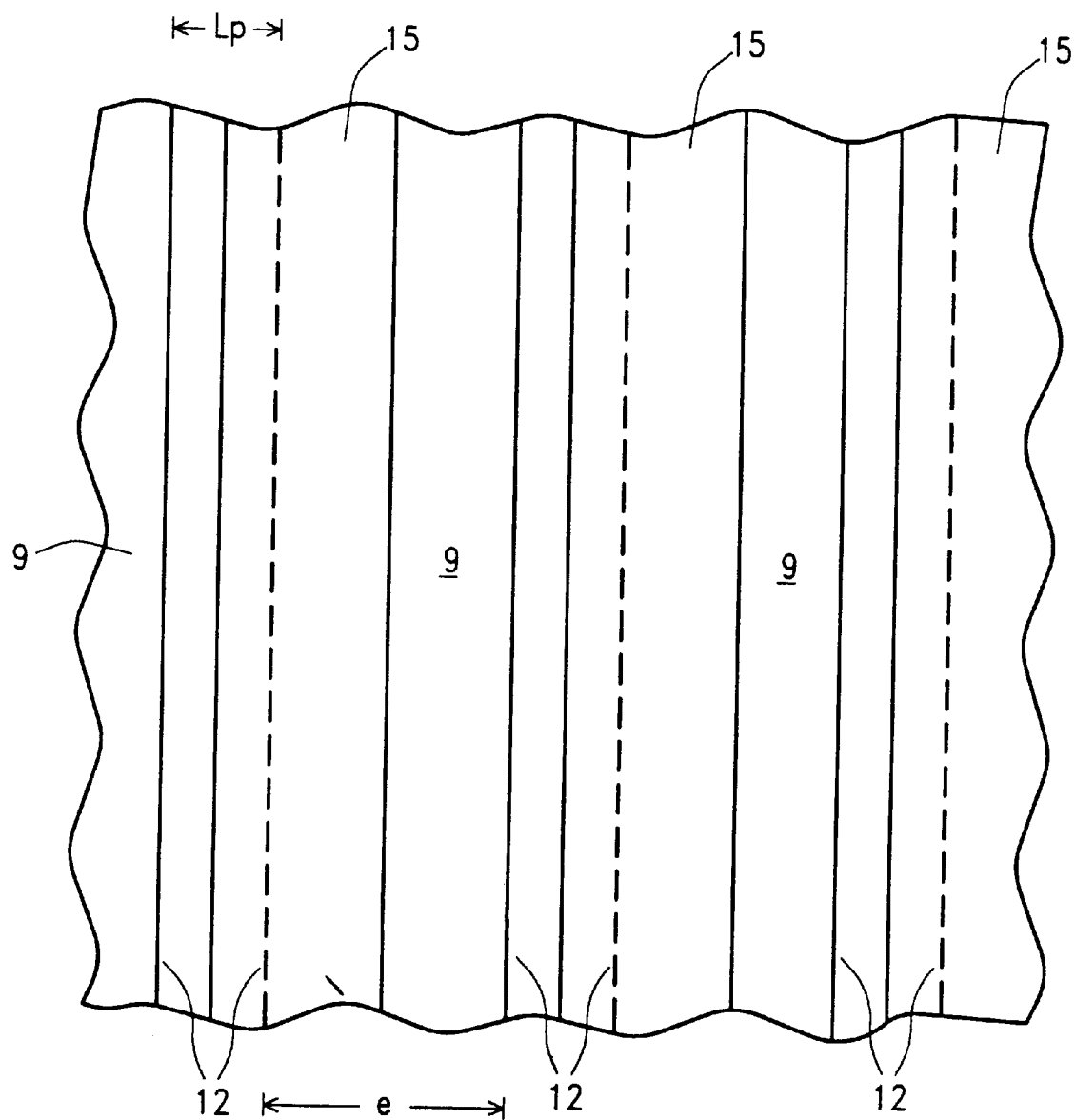
FIG. 29 is a top plan view of the portion of the MOS technology power device of FIG. 27, illustrating alignment of some photolithographic masks used for fabricating the device at an intermediate step of the manufacturing process.

This embodiment of the invention can be fabricated with the same manufacturing process previously described. The only difference is the layout of the source mask, which results in the pattern of photoresist 15 shown in FIG. 29. As discussed above with respect to the fourth embodiment, for this embodiment the distance "e" between adjacent elongated openings in the passivation and polysilicon layers 9 and 8, and the dimension Lp of the elongated openings 12 should be at least twice the alignment tolerance Lt of the photolithographic apparatus in use, to prevent layout errors due to the alignment errors between the source mask and the mask for defining the elongated openings 12.

It is to be appreciated that although FIGS. 27–28 illustrate this embodiment of the present invention as having the "bowl-like" shape as shown in FIGS. 3a and 4a, the body regions can also have the body region shape as illustrated in FIGS. 3b and 4b.

In summary, the embodiments illustrated in FIGS. 23–25 and 27–28 are better from the point of view of the ruggedness of the MOS-gated power device, but are more critical than the first three embodiments from the point of view of the alignment of the source mask with the mask for defining the elongated openings 12 in the passivation layer 9 and polysilicon layer 8. In particular, for the fourth and fifth embodiments the source mask should be aligned within the dimension Lp of the elongated opening 12. This means that the dimension Lp should be sufficient to provide for simultaneous contact to two different regions. In other words, the dimension Lp should be larger than twice the alignment tolerance Lt of the photolithographic apparatus. However, as already mentioned, the requirement of this alignment between the masks does not prevent the objective of shrinking the dimension Lp of the elongated opening 12 to the optical resolution limit of the photolithographic apparatus, since the alignment tolerance Lt is always significantly smaller than the optical resolution limit.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A process for manufacturing a MOS technology power device, comprising the steps of:

forming a first insulating material layer over a semiconductor material of a first conductivity type;

forming a first conductive material layer over the first insulating material layer;

forming a second insulating material layer over the first conductive material layer;

selectively removing the second insulating material layer and the first conductive material layer to open at least one elongated window therein, the elongated window having elongated edges;

forming a body region of a second conductivity type in the semiconductor material layer under the elongated window, the body region having a central elongated body region that has elongated edges that are substantially aligned with the elongated edges of the elongated window;

forming a deep body region of the second conductivity type below the central elongated body region;

forming a source region of the first conductivity type in the body region and a body portion of the body region wherein no dopants of the first conductivity type are provided;

forming insulating material sidewall spacers above the semiconductor material along the elongated edges of the elongated window; and forming a second conductive material layer over the second insulating material layer, the second conductive material layer contacting the source region and the body region through the elongated window.

2. The process according to claim 1, wherein the step of forming the body region includes introducing a dopant of the second conductivity type into the semiconductor material through the elongated window while using the second insulating material layer as a mask.

3. The process according to claim 2, wherein the step of forming the body region includes implanting the dopant of the second conductivity type at a prescribed high energy and in a heavy dose, the high energy being sufficient to locate a peak concentration of the dopant of the second conductivity type at a prescribed distance from a surface of the semiconductor material; and thermally diffusing the dopant of the second conductivity type into the semiconductor material so that the central elongated body region is heavily doped, and so that the body region further comprises two lateral lightly doped elongated channel regions.

4. The process according to claim 1, wherein the step of forming the body region includes:

implanting a first dopant of the second conductivity type into the semiconductor material through the elongated window using the second insulating material layer as a mask, with a first implant energy suitable to locate a peak dopant concentration of the first dopant substantially at a surface of the semiconductor material layer;

implanting a second dopant of the second conductivity type into the semiconductor material layer through the elongated window using the second insulating material layer as a mask, with a second implant dose substantially higher than that of a dose of the first implant, a second implant energy being suitable to locate a peak dopant concentration of the second dopant at a prescribed distance from the surface of the semiconductor material layer; and thermally diffusing the first dopant and the second dopant in the semiconductor material so that the central elongated body region is heavily doped, and so that the body region further comprises two lateral lightly doped elongated channel regions.

5. The manufacturing process according to claim 1, wherein the first insulating material layer is a silicon dioxide layer, the first conductive material layer is a doped polysilicon layer, and the second insulating material layer is a passivation layer.

6. The process according to claim 1, wherein the step of selectively removing the second insulating material layer and the first conductive material layer to form the elongated window includes forming the elongated window having a width substantially equal to an optical resolution limit of a photolithographic apparatus used to selectively remove the second insulating layer and the first conductive material layer.

7. The process according to claim 1, wherein the first conductive material layer comprises a doped polysilicon layer and a silicide layer.

8. The manufacturing process according to claim 7, wherein the silicide layer is a cobalt silicide layer.

9. The process according to claim 1, wherein the step of opening the elongated window includes opening a plurality of the elongated windows substantially in parallel with one another, and wherein the step of forming the body region includes forming a plurality of body regions of the second conductivity type in the semiconductor material under the plurality of elongated windows.

10. The process according to claim 1, wherein the semiconductor material is a lightly doped layer epitaxially grown over a heavily doped semiconductor substrate.

11. The manufacturing process according to claim 10, wherein the semiconductor substrate is of the first conductivity type.

12. The manufacturing process according to claim 10, wherein the semiconductor substrate is of the second conductivity type.

13. The process according to claim 1, wherein the first conductivity type is N-type, and the second conductivity type is P-type.

14. The process according to claim 1, wherein the first conductivity type is P type, and the second conductivity type is N-type.

15. A process for forming a MOS-gated apparatus, comprising the steps of:

provuding a semiconductor substrate including a semiconductor material layer of a first conductivity type disposed over a highly doped semiconductor substrate;

forming an insulated gate layer over a surface of the semiconductor material layer, the insulated gate layer including a first insulating material layer over the surface of the semiconductor substrate, a first conductive material layer over the first insulating material layer, and a second insulating material layer over the first conductive material layer;

selectively removing the second insulating material layer and the first conductive layer to provide a plurality of windows in the insulated gate layer exposing the semiconductor material layer beneath each window, wherein each window has elongated edges and a transverse dimension that is limited only by an optical resolution limit of a photolithographic apparatus used to form each window;

forming a respective body region of a second conductivity type in the surface of the semiconductor material layer through the respective window in the insulated gate layer, each body region having a central elongated body region that has elongated edges that are substantially aligned with the elongated edges of each window;

forming a respective deep body region of a second conductivity type below the respective central elongated body region through the respective window in the insulated gate layer;

forming a source region of the first conductivity type in each body region;

forming a plurality of sidewall spacers, each sidewall space disposed along a lateral edge of each window in the insulated gate layer above the surface of the semiconductor material layer; and forming a metal layer above the insulated gate layer and above the semiconductor material layer and contacting each body region and each source region through each window in the insulated gate layer.

16. The process for forming the MOS-gated apparatus as claimed in claim 15, wherein the step of forming the source region includes the steps of:

depositing a photoresist layer over the first insulating material layer;

selectively exposing the first insulating material layer to an energy source through a photolithographic mask;

selectively removing the photoresist layer and the first insulating material layer from the surface of the semiconductor substrate to form windows in the photoresist layer and the first insulating material layer;

implanting dopants of the first conductivity type through the windows in the insulated gate layer and through the windows in the photoresist layer and the first insulating material layer to form the source region within each body region; and removing the photoresist layer and the first insulating material layer.

17. The process for forming the MOS-gated apparatus as claimed in claim 16, wherein the step of forming the body region includes forming an elongated body region and wherein the step of forming the source region further includes forming a plurality of source portions in each elongated body region, the plurality of source portions being intercalated with a plurality of body portions of each elongated body region along a length of the elongated body region.

18. The process for forming the MOS-gated apparatus as claimed in claim 17, wherein the step of forming the source region further includes forming each source portion with a first length and forming each body portion with a second length, wherein the first length is greater than the second length.

19. The process for forming the MOS-gated apparatus as claimed in claim 18, wherein the step of forming the source region further includes forming each source portion within one elongated body region such that the source portion is substantially aligned in a direction transverse to the length of the elongated body region with a respective source portion in each adjacent elongated body region, and forming each body portion within the one elongated body region such that each body portion is substantially aligned in the transverse direction with a respective body portion in each adjacent elongated body region.

20. The process for forming the MOS-gated apparatus as claimed in claim 18, wherein the step of forming the source region further includes forming each source portion within one elongated body region so that it is shifted in the elongated direction of the body region with respect to a respective source portion in each adjacent elongated body region, and forming each body portion within the one elongated body region such that each body portion is shifted in the elongated direction with respect to a respective body portion in the adjacent elongated body region.

21. The process for forming the MOS-gated apparatus as claimed in claim 17, wherein the step of forming the source region further includes forming each source portion with a first length and forming each body portion with a second length, wherein the first length is substantially equal to the second length.

22. The process for forming the MOS-gated apparatus as claimed in claim 21, wherein the step of forming the source region further includes forming each source portion within one elongated body region so that each source portion is substantially aligned in a direction transverse to a length of the elongated body region with a respective body portion in each adjacent elongated body region, and forming each body portion within the one elongated body region such that each body potion is substantially aligned in the transverse direction with a respective source portion within each adjacent elongated body region.

23. The process for forming the MOS-gated apparatus as claimed in claim 16, wherein the step of forming each body region includes forming an elongated body region in the semiconductor material layer, and wherein the step of forming a source region in each elongated body region further includes the steps of:

forming a first elongated stripe having a longitudinal dimension, including a plurality of source portions intercalated with a plurality of body portions along the longitudinal dimension for substantially an entire length of the elongated body region; and forming a second elongated stripe having a longitudinal dimension and a longitudinal edge that is merged with a longitudinal edge of the first elongated stripe, and including a plurality of body portions that are intercalated with a plurality of source portions along the longitudinal dimension such that each source portion of the first elongated stripe is substantially aligned in a direction transverse to the longitudinal dimension with a respective body portion of the second elongated stripe and such that each body portion of the first elongated stripe is substantially aligned in the transverse direction with a respective source portion of the second elongated stripe.

24. The process for forming the MOS-gated apparatus as claimed in claim 16, wherein the step of forming the body region includes forming an elongated body region and wherein the step of forming the source region includes forming an elongated source region for substantially an entire length of the elongated body region.

25. The process for forming the MOS-gated apparatus as claimed in claim 15, wherein the step of forming the respective body region includes selectively introducing a dopant of the second conductivity type into the semiconductor material layer through each window while using the insulated gate layer as a mask.

26. The process for forming the MOS-gated apparatus as claimed in claim 25, wherein the step of forming the respective body region includes forming an elongated body region by implanting the dopant of the second conductivity type at a prescribed high energy and in a heavy dose, the high energy being sufficient to locate a peak concentration of the dopant of the second conductivity type at a prescribed distance from the surface of the semiconductor material layer; and thermally diffusing the implanted dopant of the second conductivity type so that the central elongated body region is heavily doped, and so that the respective body region further comprises two lateral lightly doped channel regions.

27. The process for forming the MOS-gated apparatus according to claim 15, wherein the step of forming the respective body region includes the steps of:

implanting a first dopant of the second conductivity type into the semiconductor material layer through each window using the insulated gate layer as a mask, with a first implant energy suitable to locate a peak dopant concentration of the first dopant substantially at a surface of the semiconductor material layer;

implanting a second dopant of the second conductivity type into the semiconductor material layer through each window using the insulated gate layer as a mask, with a second implant dose substantially higher than that of a dose of the first implant, a second implant energy being suitable to locate a peak dopant concentration of the second dopant at a prescribed distance from the surface of the semiconductor material layer; and thermally diffusing the dopant of the second conductivity in the semiconductor material so that the central elongated body region is heavily doped, and so that the respective body region further comprises two lateral lightly doped elongated channel regions.

28. The process according to claim 1, wherein the step of forming the deep body region includes implanting the dopant of the second conductivity type at a prescribed high energy and in a heavy dose, the high energy being sufficient to locate a peak concentration of the dopant of the second conductivity type below the central elongated body region.

29. The process according to claim 9, wherein the step of forming the deep body region includes forming a plurality of deep body regions of the second conductivity type, each deep body region below a respective central elongated body region of the plurality of body regions.

30. The process according to claim 1, wherein the step of forming the source region includes the steps of:

depositing a photoresist layer over the first insulating material layer;

selectively exposing the first insulating material layer to an energy source through a photolithographic mask;

selectively removing the photoresist layer and the first insulating material layer from a surface of the semiconductor substrate to form a window in the photoresist layer and a window in the first insulating material layer;

implanting dopants of the first conductivity type through the at least one elongated window and through the respective windows in the photoresist layer and the first insulating material layer to form the source region within the body region; and removing the photoresist layer and the first insulating material layer.

31. The process according to claim 9, wherein the step of forming the source region further includes forming a plurality of source portions in each body region, the plurality of source portions being intercalated with a plurality of body portions of each body region along a length of the respective body region.

32. The process according to claim 26, wherein the step of forming the source region further includes forming each source portion with a first length and forming each body portion with a second length, wherein the first length is greater than the second length.

33. The process according to claim 27, wherein the step of forming the source region further includes forming each source portion within one body region such that the source portion is substantially aligned in a direction transverse to the length of the body region with a respective source portion in each adjacent body region, and forming each body portion within the one body region such that each body portion is substantially aligned in the transverse direction with a respective body portion in each adjacent body region.

34. The process according to claim 27, wherein the step of forming the source region further includes forming each source portion within one body region so that it is shifted in the elongated direction of the body region with respect to a respective source portion in each adjacent body region, and forming each body portion within the one body region such that each body portion is shifted in the elongated direction with respect to a respective body portion in each adjacent body region.

35. The process according to claim 31, wherein the step of forming the source region further includes forming each source portion with a first length and forming each body portion with a second length, wherein the first length is substantially equal to the second length.

36. The process according to claim 35, wherein the step of forming the source region further includes forming each source portion within one body region so that each source portion is substantially aligned in a direction transverse to a length of the body region with a respective body portion in each adjacent body region, and forming each body portion within the one body region such that each body potion is substantially aligned in the transverse direction with a respective source portion within each adjacent body region.

37. The process according to claim 9, wherein the step of forming the source region further includes the steps of:

forming a first elongated stripe having a longitudinal dimension, including a plurality of source portions intercalated with a plurality of body portions along the longitudinal dimension for substantially an entire length of each body region; and forming a second elongated stripe having a longitudinal dimension and a longitudinal edge that is merged with a longitudinal edge of the first elongated stripe, and including a plurality of body portions that are intercalated with a plurality of source portions along the longitudinal dimension such that each source portion of the first elongated stripe is substantially aligned in a direction transverse to the longitudinal dimension with a respective body portion of the second elongated stripe and such that each body portion of the first elongated stripe is substantially aligned in the transverse direction with a respective source portion of the second elongated stripe.

38. The process according to claim 9, wherein the step of forming the source region includes forming an elongated source region for substantially an entire length of each respective body region.

39. The process for forming the MOS-gated apparatus as claimed in claim 15, wherein the step of forming the respective deep body region includes implanting the dopant of the second conductivity type at a prescribed high energy and in a heavy dose, the high energy being sufficient to locate a peak concentration of the dopant of the second conductivity type at a prescribed distance below the respective central elongated body region.

\* \* \* \* \*

UNITED STATES PATENT AND TRADEMARK OFFICE
CERTIFICATE OF CORRECTION

PATENT NO. : 5,985,721
DATED : November 16, 1999
INVENTOR(S) : Ferrucio Frisina, Angelo Magri', Giuseppe Ferla and Richard A. Blanchard It is certified that error appears in the above-identified patent and that said Letters Patent is hereby corrected as shown below:

On the title page, item [75] should read:

[75] Inventors: Ferruccio Frisina, Sant' Agata Li Battiati; Angelo Magri', Belpasso; Giuseppe Ferla, Catania, all of Italy; Richard A. Blanchard, Los Altos, California Signed and Sealed this Fifth Day of September, 2000

*Attest:*

Q. TODD DICKINSON

*Attesting Officer*    *Director of Patents and Trademarks*